(12) United States Patent
Sutardja

(10) Patent No.: US 7,265,448 B2
(45) Date of Patent: Sep. 4, 2007

(54) INTERCONNECT STRUCTURE FOR POWER TRANSISTORS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 350 days.

(21) Appl. No.: 10/765,474

(22) Filed: Jan. 26, 2004

(65) Prior Publication Data

US 2005/0161706 A1    Jul. 28, 2005

(51) Int. Cl.
    *H01L 23/48* (2006.01)
(52) U.S. Cl. .......................... 257/758; 257/759; 257/774; 257/748; 257/E23.144; 257/E23.152; 257/E27.105
(58) Field of Classification Search .................... None
    See application file for complete search history.

(56) References Cited

U.S. PATENT DOCUMENTS

| | | | |
|---|---|---|---|
| 6,051,884 A | 4/2000 | Papadas et al. | |
| 6,100,591 A | 8/2000 | Ishii | |
| 6,178,082 B1 | 1/2001 | Farooq | |
| 6,448,510 B1 | 9/2002 | Neftin et al. | |
| 6,477,034 B1 | 11/2002 | Chakravorty | |
| 6,486,557 B1 | 11/2002 | Davis et al. | |
| 2001/0045670 A1 | 11/2001 | Nojiri | |
| 2002/0076851 A1* | 6/2002 | Eden et al. | 438/106 |
| 2002/0153609 A1 | 10/2002 | Kaneko et al. | |

FOREIGN PATENT DOCUMENTS

| | | |
|---|---|---|
| EP | 0 867 929 A2 | 9/1998 |
| EP | 1 107 313 A | 6/2001 |
| WO | WO98/53499 A1 | 11/1998 |
| WO | WO 00/31797 A2 | 6/2000 |
| WO | WO 00/31797 A3 | 6/2000 |

OTHER PUBLICATIONS

Communication from the European Patent Office dated Feb. 22, 2006 for Application No. 050002849—2203.
Communication from the European Patent Office dated Nov. 14, 2006 with the extended European Search Report for Application No. 06011395.8—2203, 7 pages.
Communication from the European Patent Office dated Nov. 14, 2006 with the extended European Search Report for Application No. 06011396.6—2203, 6 pages.

* cited by examiner

*Primary Examiner*—Sue A. Purvis
*Assistant Examiner*—Scott Wilson

(57) ABSTRACT

An integrated circuit according to the present invention includes first, second and third plane-like metal layers. A first transistor has a first control terminal and first and second terminals. The second terminal communicates with the first plane-like metal layer. The first terminal communicates with the second plane-like metal layer. A second transistor has a second control terminal and third and fourth terminals. The third terminal communicates with the first plane-like metal layer. The fourth terminal communicates with the third plane-like metal layer. A fourth plane-like metal layer includes first, second and third contact portions that are electrically isolated from each other and that are connected to the second plane-like metal layer, the first plane-like metal layer and the third plane-like metal layer, respectively.

47 Claims, 30 Drawing Sheets

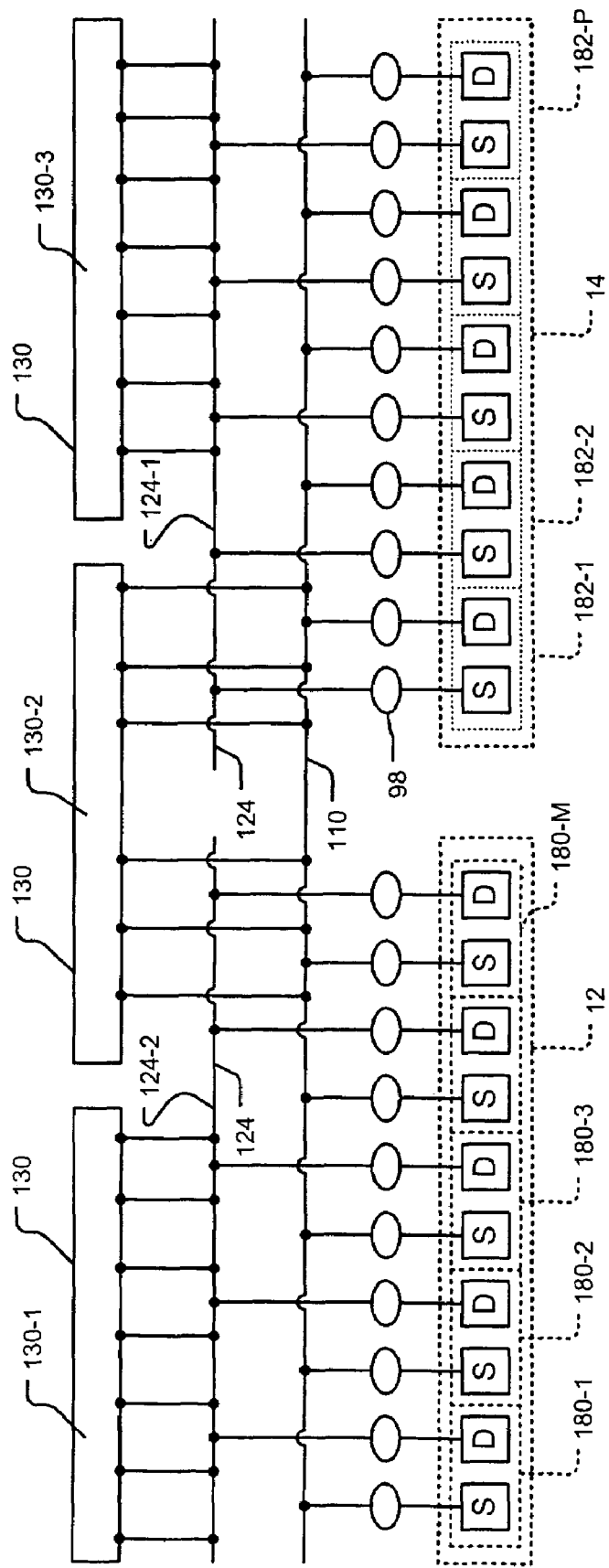

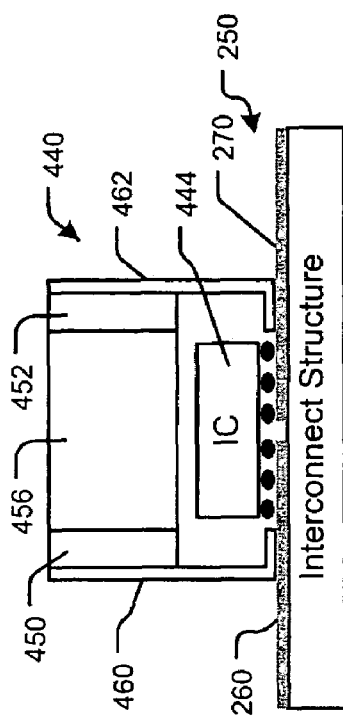
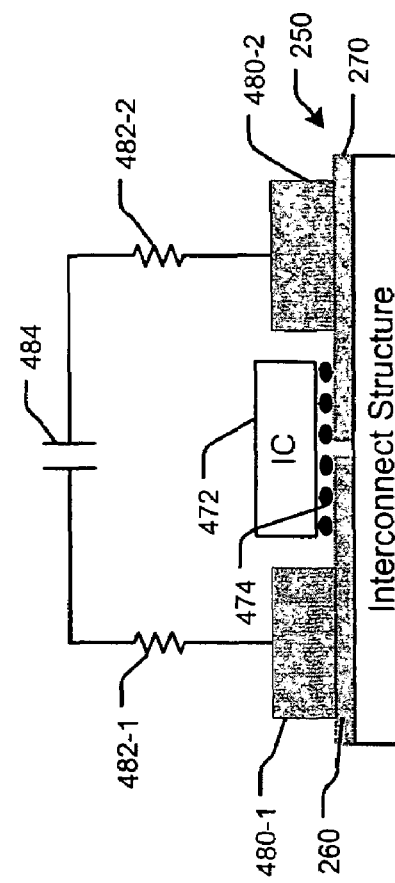
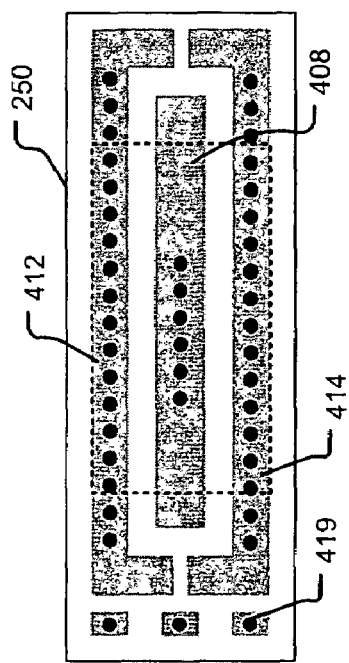
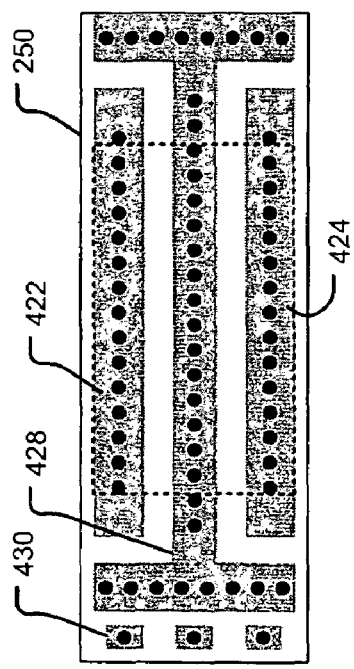

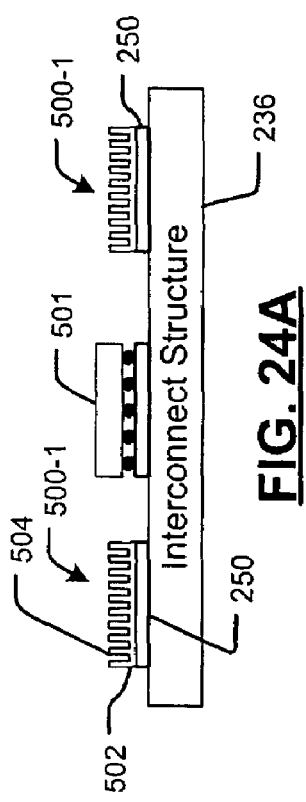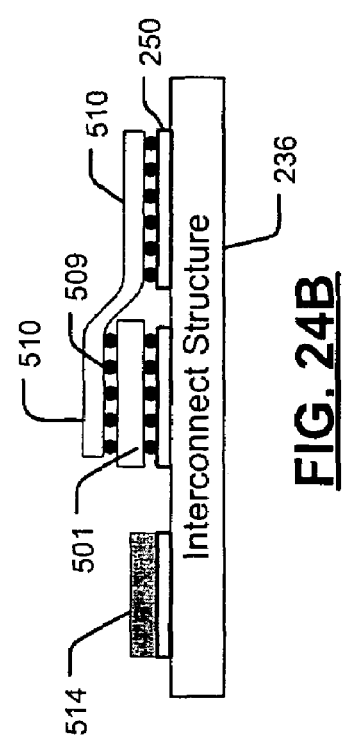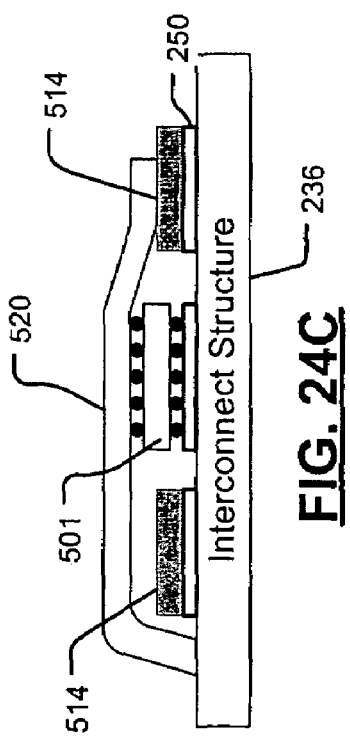

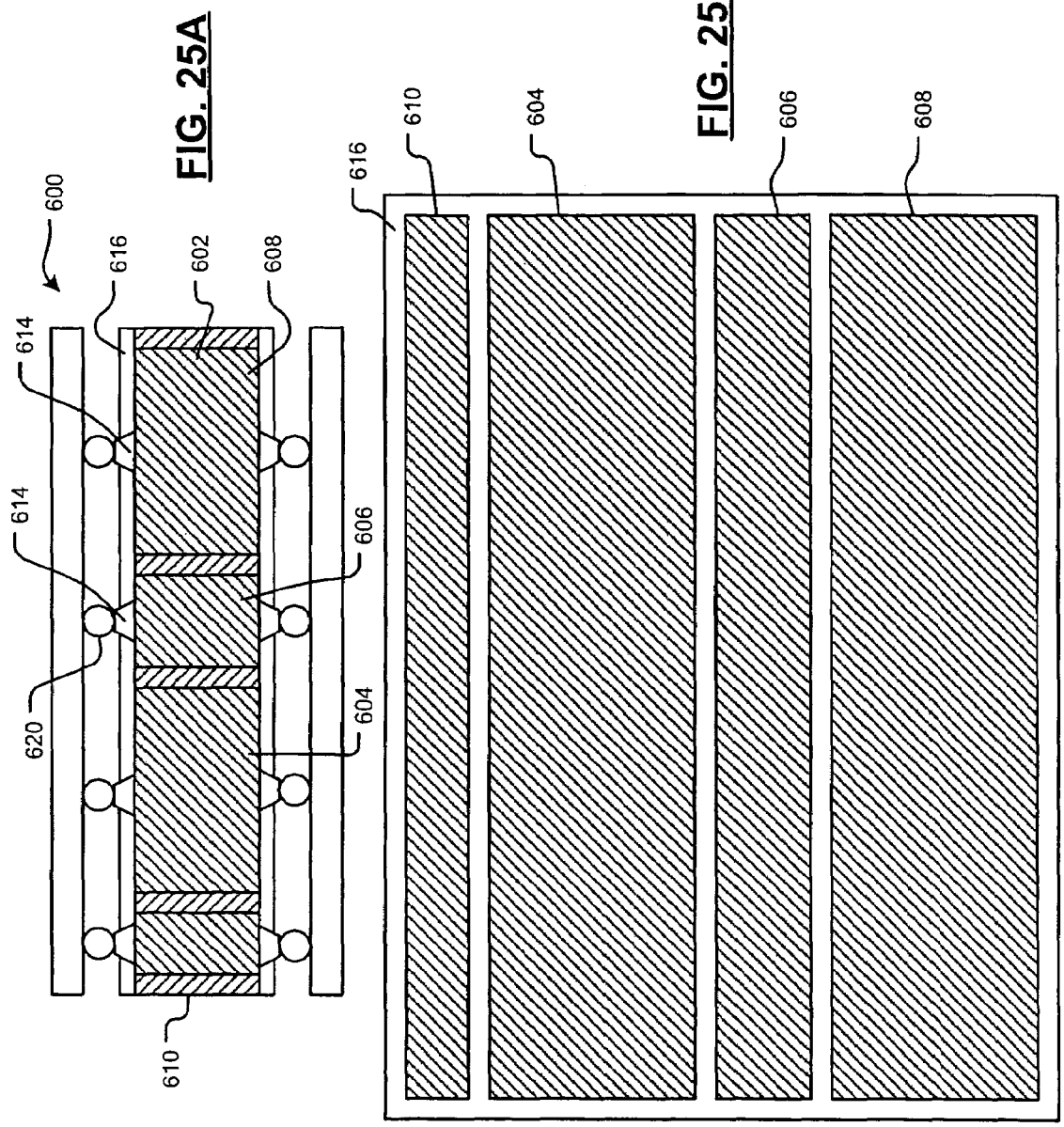

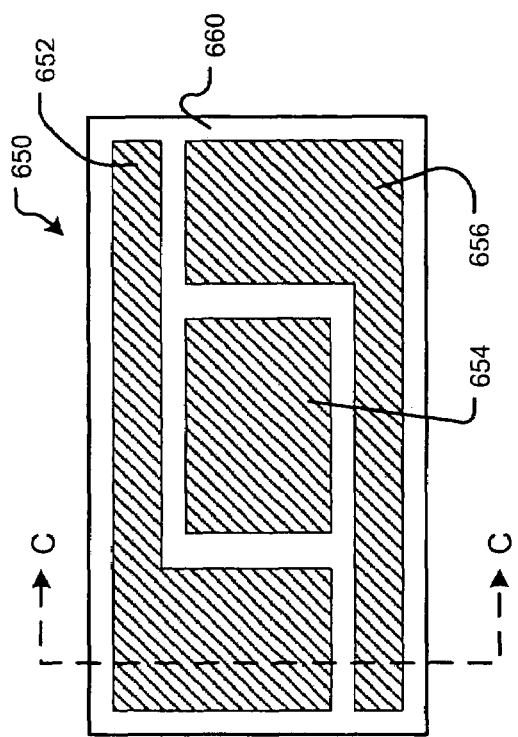
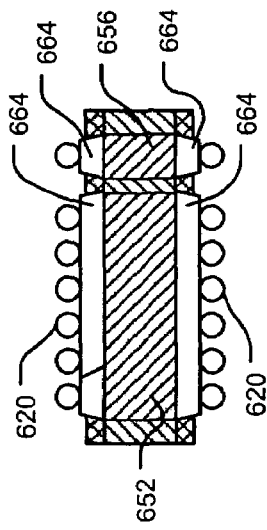
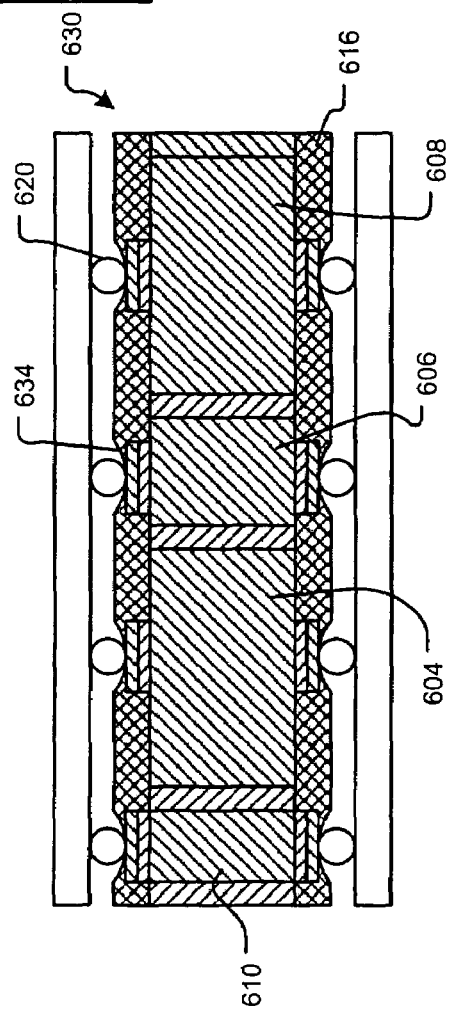
FIG. 27A
FIG. 27B
FIG. 26

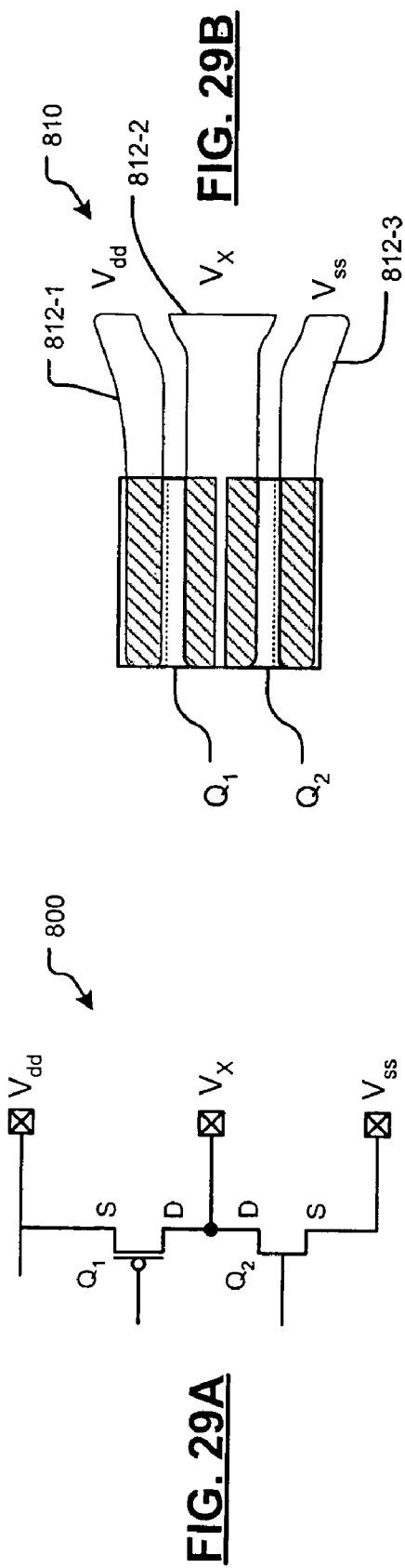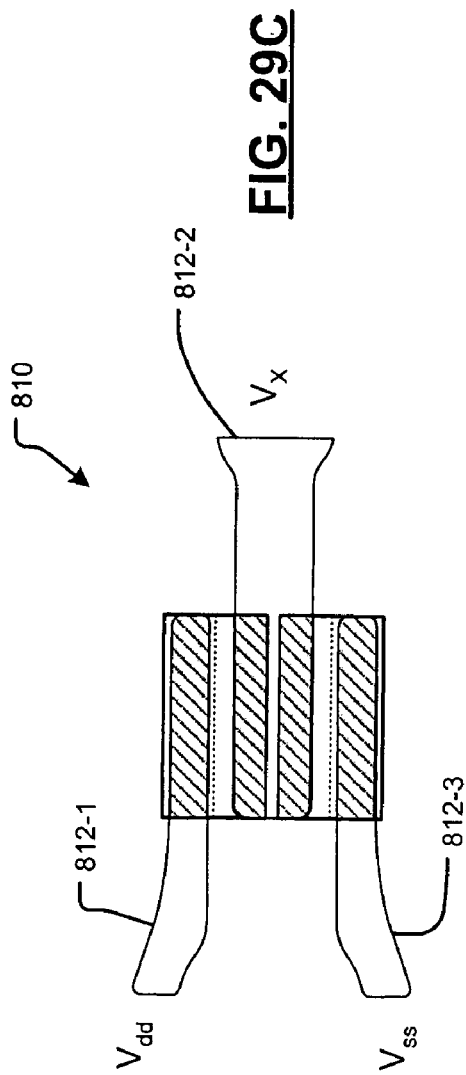
FIG. 29A
FIG. 29B
FIG. 29C

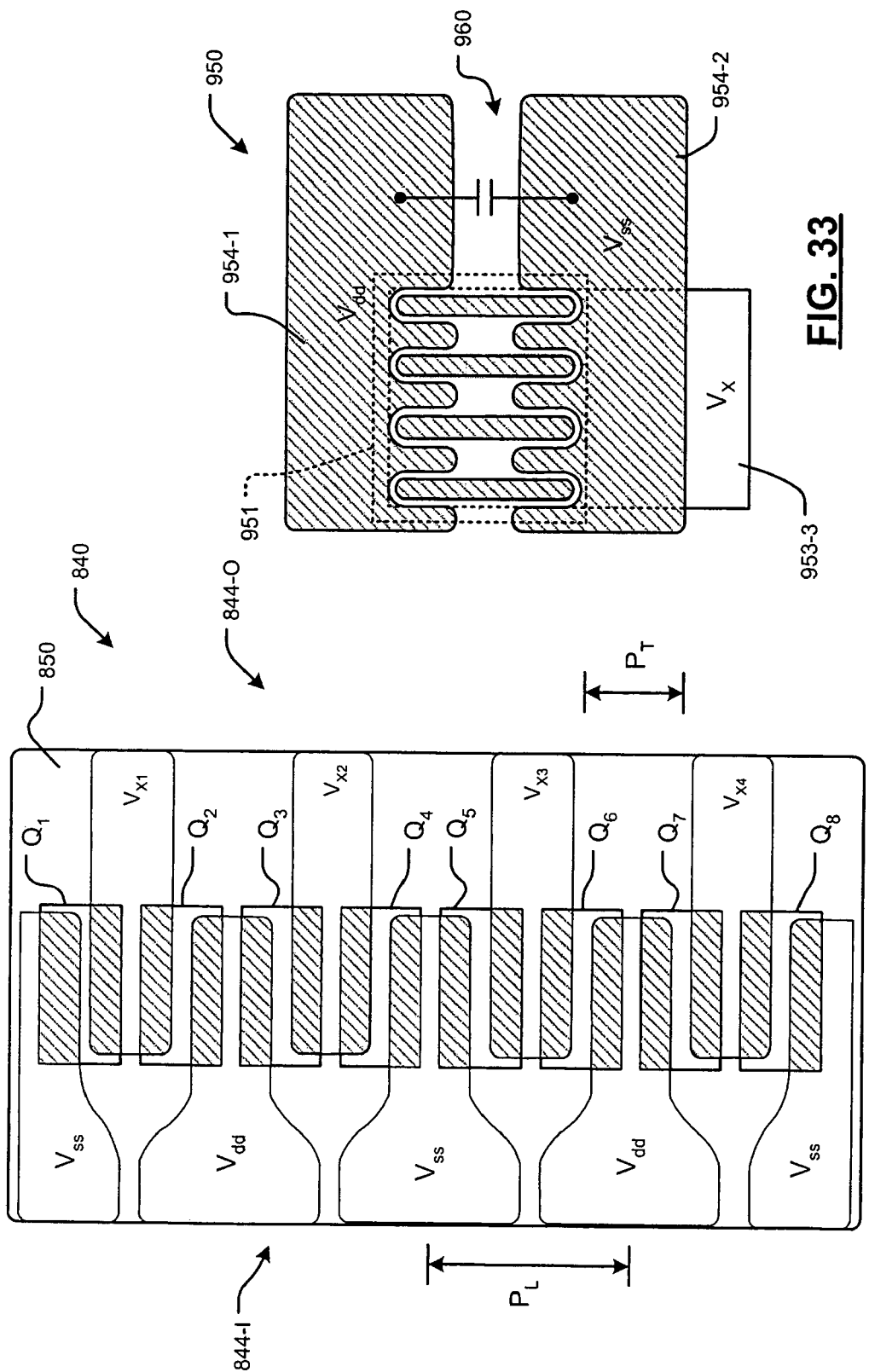

INTERCONNECT STRUCTURE FOR POWER TRANSISTORS

FIELD OF THE INVENTION

The present invention relates to integrated circuits, and more particularly to integrated circuits and interconnect structures for integrated circuits.

BACKGROUND OF THE INVENTION

Power integrated circuits (ICs) or power ICs may be used to supply power in variety of different applications. For example, power ICs may be used to supply power in pulse width modulation circuits. A drive IC may be used to provide input voltages and control signals to the power IC. Therefore, the drive IC and the power IC must be connected together. However, the drive IC and the power IC may be implemented using different IC technology. For example, the power IC may be implemented using MOSFET technology and the drive IC may employ standard IC technology. Therefore, packaging of the power IC and the drive IC may be problematic.

Typically, an integrated circuit (IC) is designed with pads, which are used to provide external connections to the IC. The IC is typically mounted on a package, which may include pins for connecting the package and its circuits to other electronic devices. The pins of the package are sometimes connected to the pads of the IC using bondwires. The bondwires, however, may have a resistance that is greater than 50-100 mΩ. The combined resistance of the bondwires increases the power dissipation of the IC. Therefore, when the IC has a large number pads that need connections, bondwires may not be an acceptable approach. To reduce parasitic packaging resistance, wires and/or traces that are arranged on a substrate such as a printed circuit board are sometimes used to provide interconnects. While this approach offers some improvement over bondwires, the wires and/or traces also have unacceptably high parasitic packaging resistance for ICs requiring a large number of connections.

SUMMARY OF THE INVENTION

An integrated circuit according to the present invention includes first, second and third plane-like metal layers. A first transistor has a first control terminal and first and second terminals. The second terminal communicates with the first plane-like metal layer. The first terminal communicates with the second plane-like metal layer. A second transistor has a second control terminal and third and fourth terminals. The third terminal communicates with the first plane-like metal layer. The fourth terminal communicates with the third plane-like metal layer. A fourth plane-like metal layer includes first, second and third contact portions that are electrically isolated from each other and that are connected to the second plane-like metal layer, the first plane-like metal layer and the third plane-like metal layer, respectively.

In other features, the fourth plane-like metal layer is thicker than the first, second and third plane-like metal layers. The second and third plane-like metal layers are coplanar or are located in separate planes. A local interconnect is arranged between the first plane-like metal layer and the first, second and control terminals of the first and second transistors.

In still other features, the first and second transistors are NMOS transistors. The first and second control terminals are gates. The first and third terminals are drains and the second and fourth terminals are sources.

In other features, the first transistor is a PMOS transistor. The first control terminal of the first transistor is a gate. The first terminal of the first transistor is a source and the second terminal of the first transistor is a drain. The second transistor is an NMOS transistor. The second control terminal of the second transistor is a gate and the third terminal of the second transistor is a drain. The fourth terminal of the second transistor is a source.

In still other features, the first plane-like metal layer is arranged between the second and third plane-like metal layers and the first and second transistors. Alternately, the second and third plane-like metal layers are arranged between the first plane-like metal layers and the first and second transistors. Insulating material is arranged between the first, second, third and fourth plane-like metal layers.

In other features, the first, second, and third contact portions have an elliptical shape. Alternately, the first and third contact portions have a base portion and wings that extend from the base portion. The second contact portions are received between the wings of the first and third contact portions. The integrated circuit has a length to width ratio of at least 2:1.

In other features, the integrated circuit implements a power IC. The first contact portion supplies a first voltage potential to the power IC. The third contact portion supplies a second voltage potential to the power IC. The second contact portion receives an output voltage of the power IC.

In still other features, additional contact portions are arranged in the fourth plane-like metal layer. A local interconnect is connected by vias to the additional contact portions and to at least one of the first and second control terminals of the transistors.

In still other features, a leadframe includes first, second and third transmission lines that communicate with the first, second and third contact portions. The integrated circuit and the first, second and third transmission lines are encased by a mold compound. The leadframe and the integrated circuit implement a quad flat no-lead (QFN) package.

In still other features, a system comprises the integrated circuit and a first transmission line that communicates with the first contact portion. A second transmission line communicates with the second contact portion. A third transmission line communicates with the third contact portion. A capacitance has one end that communicates with the second transmission line and an opposite end that communicates with the third transmission line.

In other features, the first transmission line is located in a first layer. The second and third transmission lines are located in a second layer. The first, second and third transmission lines are arranged on a substrate. The second transmission line is associated with $V_{ss}$ and the third transmission line is associated with $V_{dd}$.

In other features, the first, second and third contact portions of the fourth plane-like metal layer substantially overlap an underlying area defined by the first and second transistors. The first, second and third contact portions each substantially cover approximately ⅓ of the underlying area.

An interconnect structure according to the present invention connects a first integrated circuit to a second integrated circuit and includes a first dielectric layer. A first metal buildup layer is arranged on one side of the first dielectric layer. A second metal layer is arranged on an opposite side of the first dielectric layer. A plurality of vias connect the first metal buildup layer to the second metal layer. The first metal buildup layer defines first, second and third contact portions that are electrically insulated from each other. The first and third contact portions have a base portion and wings that extend from the base portion. The second contact portions have a generally rectangular shape and are received between the wings of the first and third contact portions.

In other features, a solder mask is arranged on the second metal layer and defines openings to the second metal layer. Solder balls are located in the openings and connect the second metal layer to one of the first and second integrated circuits.

In yet other features, the vias are laser drilled and the first metal buildup layer includes Copper that is electroplated to the first dielectric layer. A substrate is arranged between the second metal layer and a third metal layer and includes plated through holes that connect the second metal layer to the third metal layer. A second dielectric layer is arranged adjacent the third metal layer. A fourth metal layer is arranged between the dielectric layer and the solder mask. The second dielectric layer includes laser drilled vias that connect the third metal layer to the fourth metal layer.

In still other features, a decoupling capacitor is connected to contact portions of the first metal buildup layer. A heat sink is connected to the first metal buildup layer. The first integrated circuit is a power IC and the second integrated circuit is a drive IC.

In other features, the first plane-like metal layer covers greater than approximately 80% of both of the underlying first and second transistors. The second and third plane-like metal layers cover greater than approximately 80% of the first and second transistors, respectively. The first, second and third plane-like metal layers allow current to flow in both x and y directions. The x direction is orthogonal to the y direction.

An interconnect structure according to the present invention connects a first integrated circuit to a second integrated circuit. An aluminum core has first, second and third conducting portions that are defined therein and that are insulated from each other. First, second and third inverted vias are arranged on one side of respective ones of the first, second and third conducting portions.

In other features, fourth, fifth and sixth inverted vias are arranged on an opposite side of respective ones of the first, second and third conducting portions. A stiffening material is arranged between the first, second and third inverted vias and/or the fourth, fifth and sixth inverted vias.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 5A is an electrical schematic illustrating the power IC of FIG. 1A;

FIG. 5B is an electrical schematic illustrating the power IC of. FIG. 1B;

FIGS. 20 and 21 show alternate embodiments of the top metal buildup layers of the interconnect structure;

FIGS. 22 and 23 are partial cross-sectional views of the interconnect structure (taken along B-B in FIG. 8B) with decoupling capacitors that are attached to the interconnect structure of FIG. 8B;

FIGS. 24A, 24B and 24C illustrate various exemplary heat sinks that can be arranged on the interconnect structure;

FIGS. 25A and 25B illustrate an interconnect structure including an aluminum core;

FIG. 26 illustrates an alternate interconnect structure with an aluminum core;

FIGS. 27A and 27B are a plan view and a cross-sectional view (taken along line C-C in FIG. 27A), respectively, of a second alternate exemplary layout for the interconnect structure with an aluminum core;

FIG. 29A is an electrical schematic of another exemplary power IC;

FIGS. 29B and 29C are plan views of leadframes that include transmission lines that are connected to the power IC of FIG. 29A;

FIG. 31 is a plan view of another leadframe including input side transmission lines and output side transmission lines for another exemplary power IC;

FIG. 33 is a plan view of a substrate with transmission lines and a coupling capacitor connected between at least two of the transmission lines.

DETAILED DESCRIPTION OF THE PREFERRED EMBODIMENTS

Figure 1B:
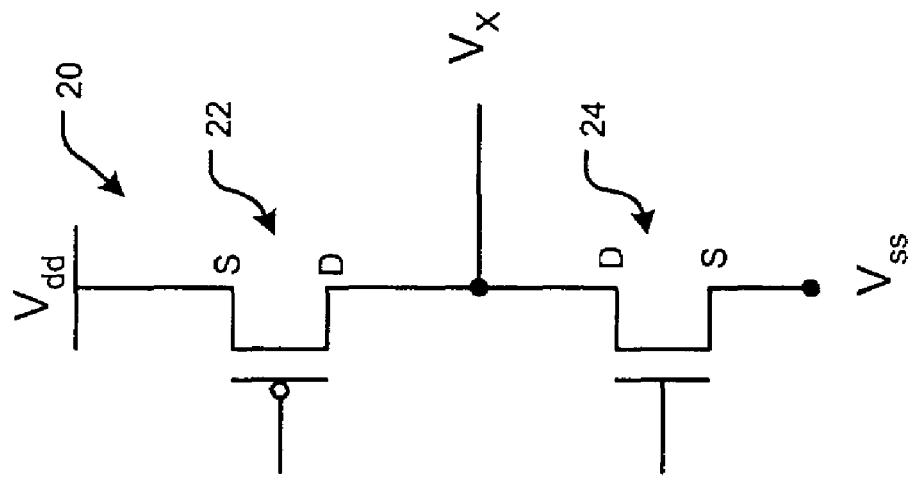
FIG. 1B is an electrical schematic of a second exemplary power IC with first and second interconnected transistors.

The following description of the preferred embodiment(s) is merely exemplary in nature and is in no way intended to limit the invention, its application, or uses. For purposes of clarity, the same reference numbers will be used in the drawings to identify similar elements.

Figure 1A:
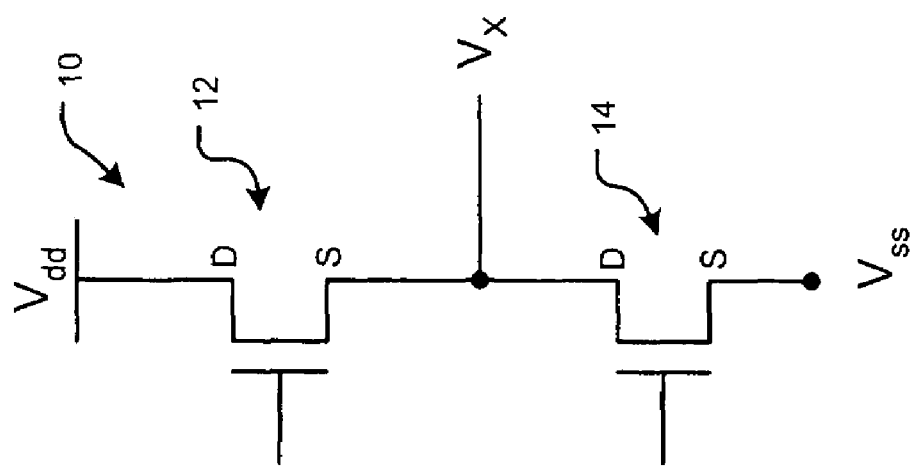
FIG. 1A is an electrical schematic of a first exemplary power IC with first and second interconnected transistors.

Referring now to FIG. 1A, a power IC 10 includes first and second power transistors 12 and 14. While first and second power transistors 12 and 14 are shown, additional transistors may be used to implement the power IC. In one implementation, the power IC 10 is used in a pulse width modulation circuit. A source of the first transistor 12 is connected to a drain of the second transistor 14. A supply voltage $V_{dd}$ is connected to a drain of the first transistor 12. A reference potential $V_{ss}$ such as ground is connected to a source of the second transistor 14. An output voltage $V_x$ is taken between the source and drain of the first and second transistors 12 and 14, respectively. The transistor 12 is an NMOS transistor and the transistor 14 is an NMOS transistor, although other types of transistors may be used.

Referring now to FIG. 1B, another configuration of a power IC 20 includes first and second power transistors 22 and 24. While first and second power transistors 22 and 24 are shown, additional transistors may be used to implement the power IC. A drain of the first transistor 22 is connected to a drain of the second transistor 24. A supply voltage $V_{dd}$ is connected to a source of the first transistor 22. A reference potential $V_{ss}$ such as ground is connected to a source of the second transistor 24. The transistor 22 is a PMOS transistor and the transistor 24 is an NMOS transistor, although other types of transistors may be used. An output voltage $V_x$ is taken between the drains of the first and second transistors 22 and 24.

Figure 2:
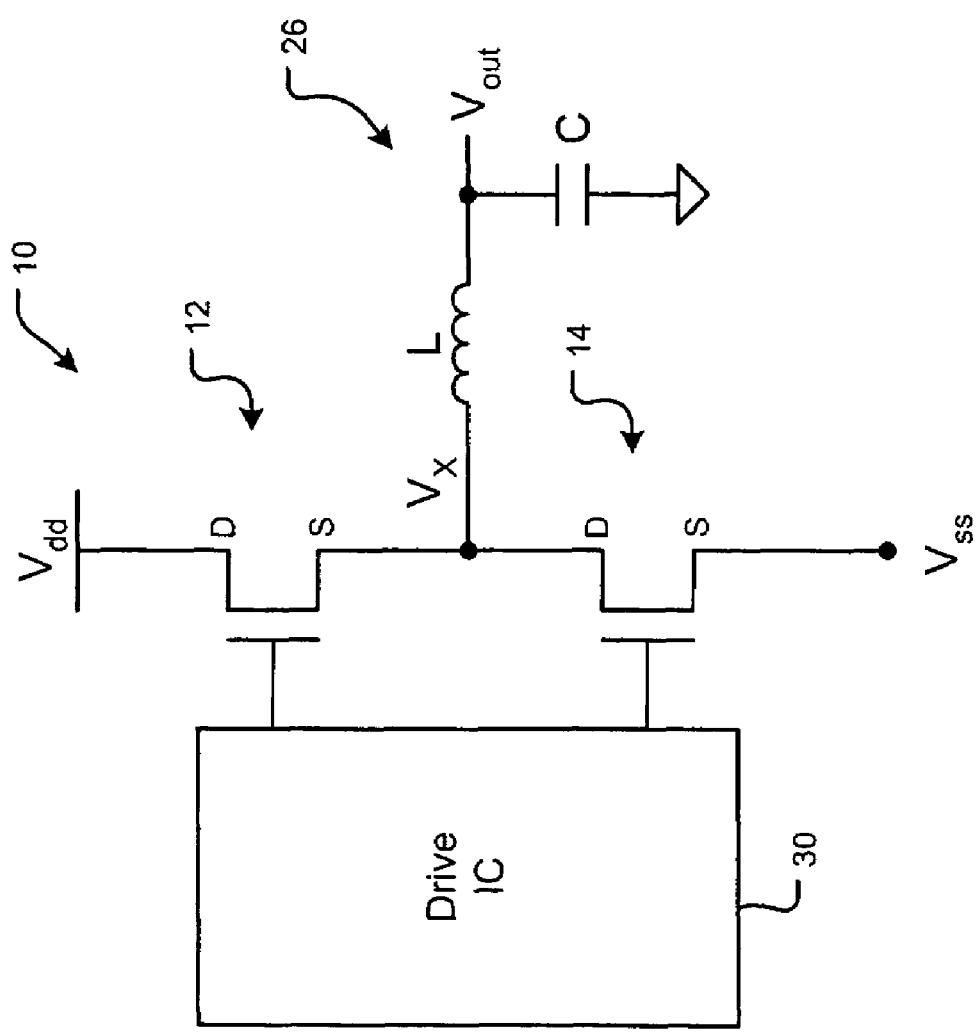
FIG. 2 is an electrical schematic and functional block diagram of the power IC of FIG. 1 connected to a drive IC.

Referring now to FIG. 2, the power transistors 10 and 20 may be connected to a drive IC. The processes that are used for the power IC 10 and/or 20 may not be the same as those used for the drive IC 30. For example, the power IC 10 and/or 20 may be implemented using MOSFET technology whereas the drive IC 30 may employ standard IC technology. While MOSFET/standard processes are disclosed, other processes can be used. The output signal $V_x$ may be output to one or more components 26, which may include a series inductor L and a parallel capacitor C.

Figure 3:
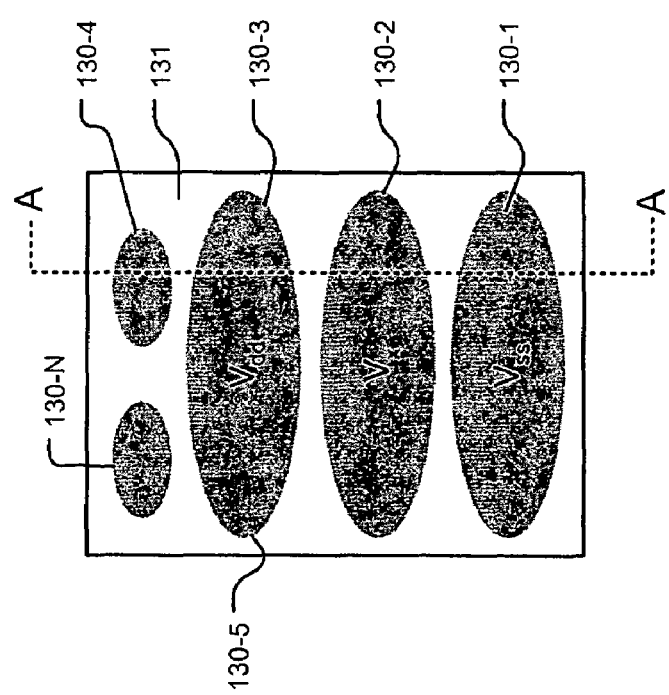
FIG. 3 is a plan view of a first layout for a top metal layer of the power IC.

Referring now to FIG. 3, an exemplary plan view of a top metal layer 130 is shown. While connections to first and second power transistors are shown, additional connections may be provided for additional transistors that may be used to implement the power IC. First, second and third contact portions 130-1, 130-2, and 130-3 have an elliptical shape. In this implementation, the first contact portion 130-1 is connected to $V_{dd}$, the second contact portion 130-2 is connected to $V_x$ and the third contact portion 130-3 is connected to $V_{ss}$. A fourth contact portion 130-4 is associated with a control signal such as a gate control signal. Additional control signals may be provided via additional contact portions 130-N. An insulating material 131 is arranged between the contact portions 130 to electrically isolate the contact portions.

Figure 4A:
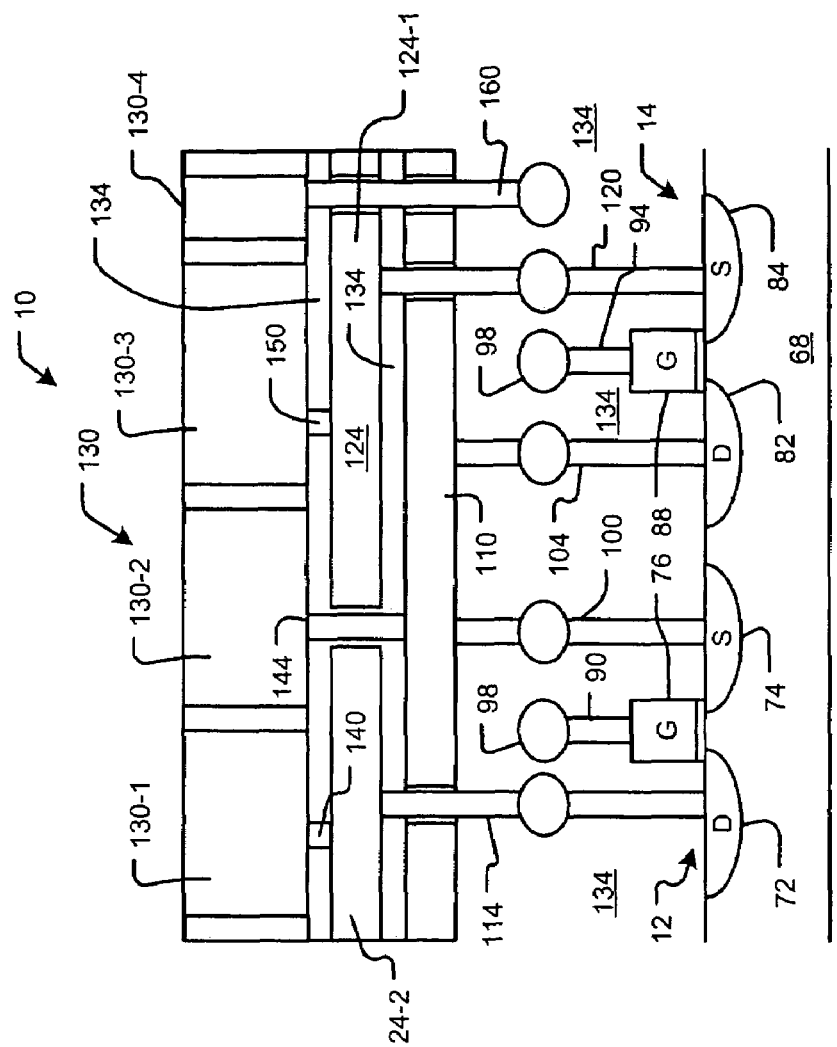
FIG. 4A is a cross-sectional view of the power IC layout according to the present invention taken along A-A in FIG. 3 for the power IC of FIG. 1A.

Referring now to FIG. 4A, one exemplary implementation of the power IC 10 corresponding to FIG. 1A is shown in further detail. The first transistor 12 includes a drain 72, a source 74, and a gate 76. The second transistor 14 includes a drain 82, a source 84, and a gate 88. The transistors 12 and 14 are NMOS transistors, although other transistor types can be used. While first and second power transistors 12 and 14 are shown, additional transistors are typically used to implement the power IC 10, as will be described below. The gate 76 of the first transistor 12 is connected by vias 90 to local interconnects 98. The local interconnects 98 are weak local interconnects such as standard wiring. As used herein, the term vias refers to a sufficient number of vias that are required to minimize resistance to a desired level. The gate 88 of the second transistor 14 is connected by vias 94 to local interconnects 98.

The source 74 of the first transistor 12 and the drain 82 of the second transistor 14 are connected by local interconnects 98 and vias 100 and 104, respectively, to a plane-like metal layer 110. As used herein, the term plane-like metal layer refers to a strong interconnect plane rather than weak local interconnects such as standard wiring. The plane-like metal layer allows current to flow in x and y directions rather than in a single direction such as x or y, which would be the case for weak local interconnects such as standard wiring.

On a macroscopic level, when current flows through weak local interconnects or standard wiring from point A to point B, it generally flows in a single direction such as the x direction. When current flows through a plane-like metal layer from point A to points B and C or from many points to many points in the plane-like metal layer connections according to the present invention, current flows in both x and y directions, where the x direction is orthogonal to the y direction. The plane-like metal layer may or may not include insulated vias passing therethrough and/or vias that are connected thereto. The plane-like metal layer may also have holes that are disbursed therein regularly, randomly or in any other pattern. The plane-like metal layer may have a uniform shape such as but not limited to a rectangle or square or a non-uniform or irregular shape.

The drain 72 of the first transistor 12 is connected by local interconnects 98 and vias 114 to a second plane-like portion 124-2 of a plane-like metal layer 124. The source 84 is connected by local interconnects 98 and vias 120 to a first plane-like portion 124-1 of the plane-like metal layer 124. The first and second plane-like portions 124-1 and 124-2 of the plane-like metal layer 124 are electrically isolated from each other.

The top metal layer 130 is preferably thicker than the plane-like metal layers 98, 110, and 124. As can be appreciated, one or more insulating layers 134 provide electrical insulation, for example between the metal layers 110, 124, and 130 to electrically isolate the layers 110, 124, and 130. The top metal layer 130 defines the contact portions 130-1, 130-2, 130-3, 130-4, . . . , and 130-N that are electrically isolated from each other. The first contact portion 130-1 is connected by vias 140 to the second plane-like portion 124-2 of the plane-like metal layer 124. The second contact portion 130-2 is connected by vias 144 to the plane-like metal layer 110. The third contact portion 130-3 is connected by vias 150 to the first plane-like portion 124-1 of the plane-like metal layer 124. The fourth contact portion 130-4 is connected by vias 160 to the metal interconnect 98. The plane-like metal layers 110 and 124 provide strong plane interconnects while the interconnect 98 provides a weak/local interconnect.

Figure 4B:
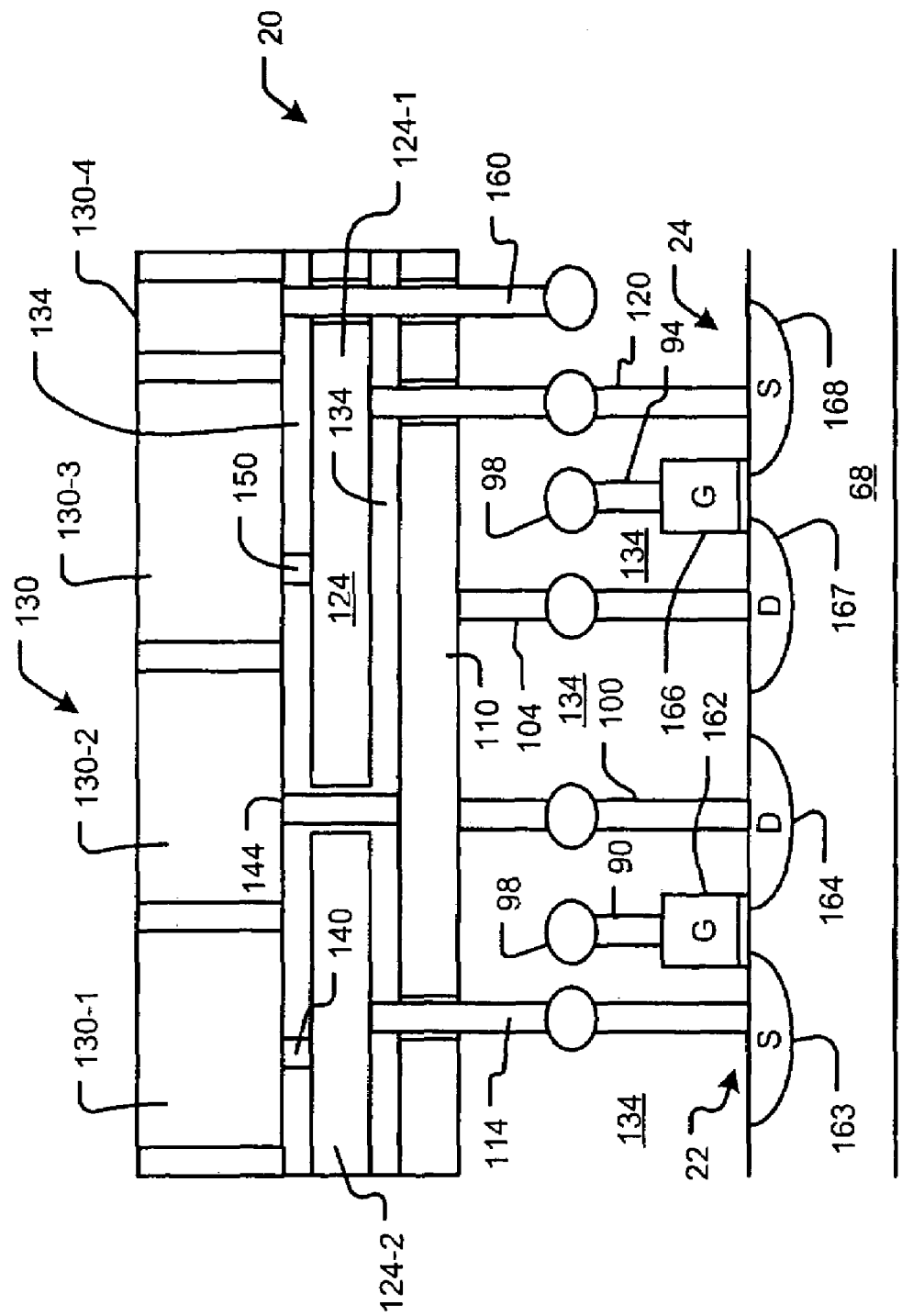
FIG. 4B is a cross-sectional view of the power IC layout according to the present invention taken along A-A in FIG. 3 for the power IC of FIG. 1B.

As can be appreciated by skilled artisans, the power IC 20 corresponding to FIG. 1B will have a somewhat similar layout to that shown in FIG. 4A. Referring now to FIG. 4B, the transistor 22 includes a gate 162, a source 163 and a drain 164. The transistor 24 includes a gate 166, a drain 167 and source 168. In one implementation, the transistors 22 and 24 are PMOS and NMOS transistors, respectively, although other transistor types can be used. The source 163 is connected by vias 114 to the second plane-like portion 124-2 of the plane-like metal layer 124. The drains 164 and 167 are connected by vias 100 and 104, respectively, to the plane-like metal layer 110. The source 168 is connected by vias 120 to the first plane-like portion 124-1 of the plane-like metal layer 124.

While the plane-like metal layer 124 in FIGS. 4A and 4B is shared, skilled artisans will appreciate that the plane-like metal layer 110 can be shared instead of the plane-like metal layer 124. In addition, while the source 74 of the first transistor 12 and the drain 82 of the second transistor 14 are shown to be connected in FIG. 4A (and the drains 164 and 167 in FIG. 4B), there are other implementations that may have separate connections. The power IC may be connected to other circuits using solder balls and a solder mask, adhesive such as anisotropic adhesive and/or any other suitable attachment method. The use of global metal planes for $V_{ss}$, $V_{dd}$ and/or $V_x$ provides the lowest impedance connection to the power IC, which reduces power dissipation.

Figure 4C:
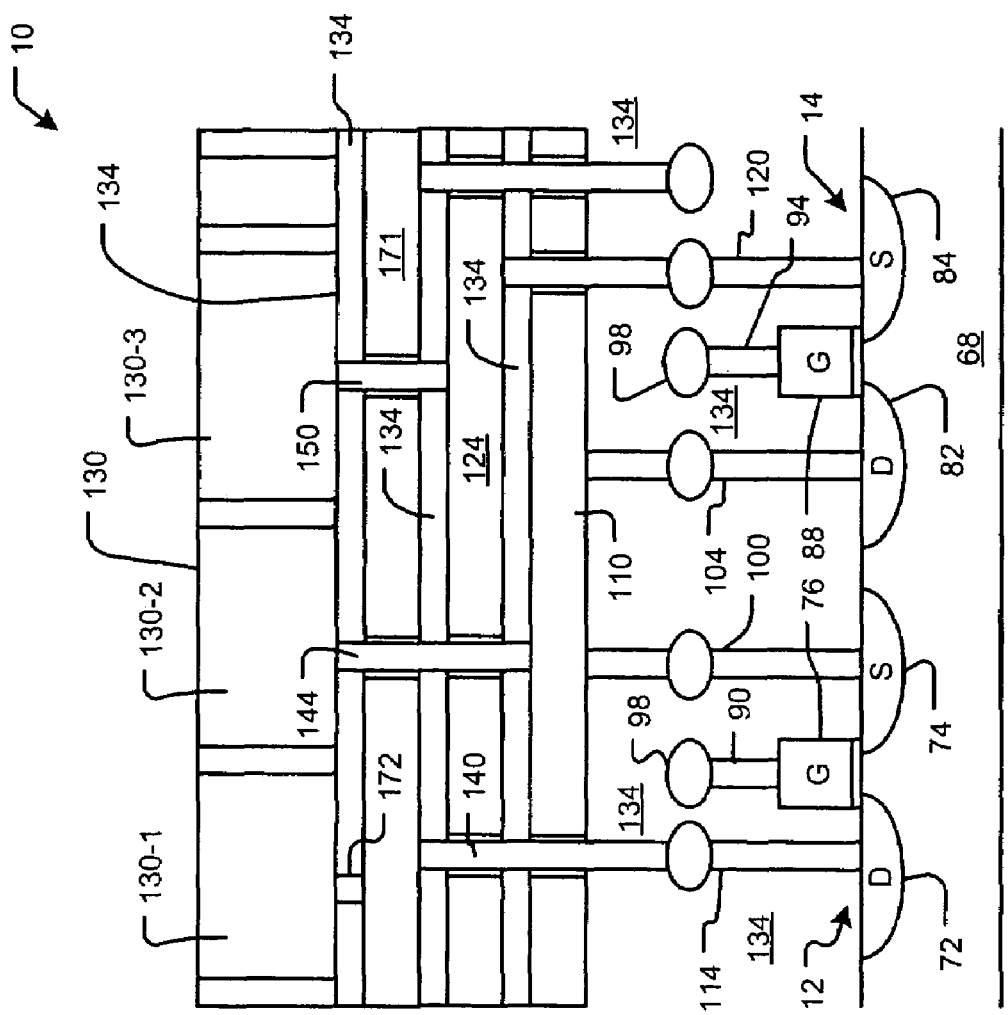
FIG. 4C is a cross-sectional view of an alternate power IC layout according to the present invention taken along A-A in FIG. 3 for the power IC of FIG. 1A.

Referring now to FIG. 4C, an additional plane-like metal layer 171 is provided for the layout corresponding to FIGS. 1A and 4A. While first and second power transistors are shown, additional transistors are typically used to implement the power IC. The plane-like metal layer 124 is no longer shared. The first contact portion 130-1 is connected by vias 172 to the plane-like metal layer 171. The vias 140 connect the drain 72 to the plane-like metal layer 171. The source 74 and the drain 82 are connected by the vias 100 and 104, respectively, to the plane-like metal layer 110. Skilled artisans will appreciate that an additional layer can also be added to the layouts corresponding to FIGS. 1B and 4B.

Referring now to FIG. 5A, the first power transistor 12 is shown to include multiple transistors 180-1, 180-2, . . . , and 180-M each with sources S and drains D. The second power transistor 14 is shown to include multiple transistors 182-1, 182-2, . . . , and 182-P each with sources S and drains D. The plane-like metal layers 110 and 124 provide a strong plane interconnect while the interconnect 98 provides a weak local interconnect such as standard wiring. In the implementation that is shown in FIG. 5A, the transistors 12 and 14 are NMOS transistors, although other transistor types can be used.

The sources S of the first power transistor 12 and the drains D of the second power transistor 14 are connected to the plane-like metal layer 110 via the local interconnect 98. The drains D of the first power transistor 12 are connected to the second plane-like portion 124-2 of the plane-like metal layer 124. The sources S of the second power transistor 14 are connected to the first plane-like portion 124-1 of the plane-like metal layer 124. The first and second plane-like portions 124-1 and 124-2 are electrically isolated.

The first contact portion 130-1 of the top plane-like metal layer 130 is connected to the second plane-like portion 124-2. The second contact portion 130-2 of the top plane-like metal layer 130 is connected to the plane-like metal layer 110. The third contact portion 130-3 of the top plane-like metal layer 130 is connected to the first plane-like portion 124-1. The plane-like portions 124-1 and 124-2 preferably covers approximately 80%-100% of the underlying transistors 14 and 12, respectively. The plane-like metal layer 110 covers approximately 80%-100% of the underlying transistors 12 and 14.

Figure 5B:
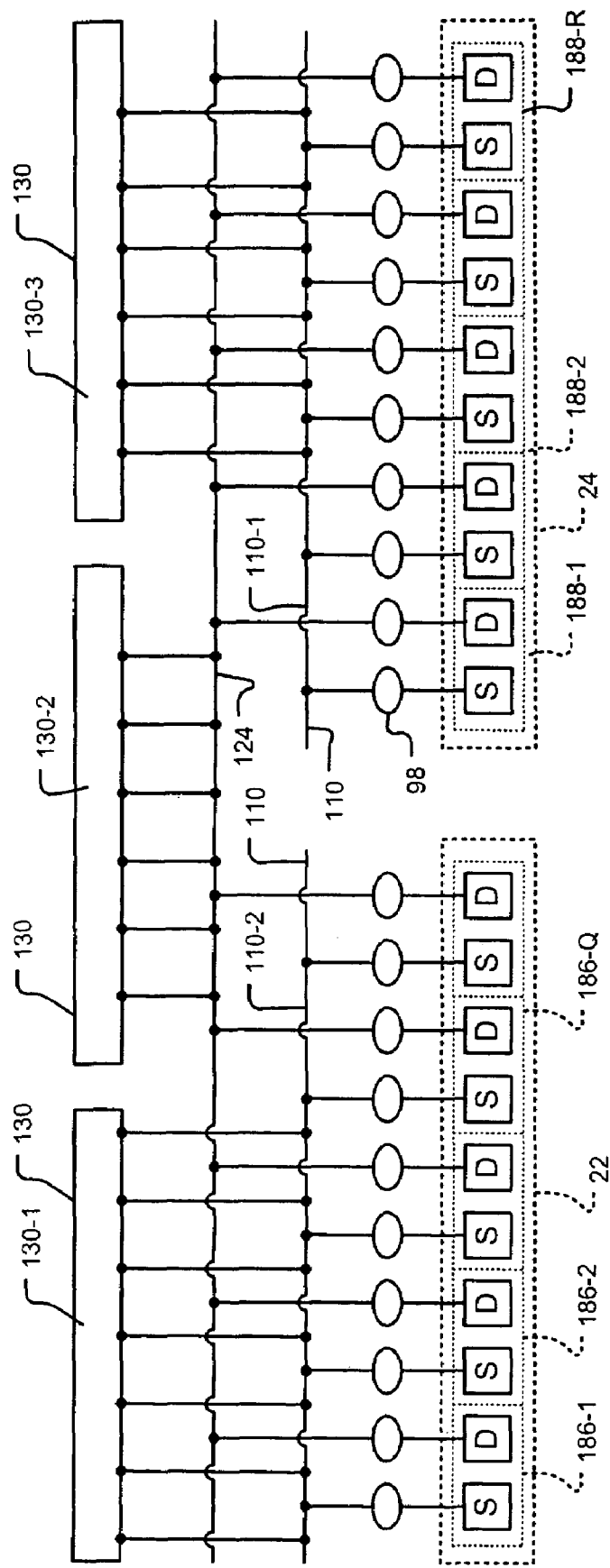

Referring now to FIG. 5B, the first power transistor 22 is shown to include multiple transistors 186-1, 186-2, . . . , and 186-Q each with sources S and drains D. The second power transistor 24 is shown to include multiple transistors 188-1, 188-2, . . . , and 188-R each with sources S and drains D. In the implementation that is shown in FIG. 5B, the first power transistor 22 is an PMOS transistor and the second power transistor 24 is an NMOS transistor, although other transistor types can be used. The drains D of the first power transistor 22 and the drains D of the second power transistor 24 are connected to the plane-like metal layer 124. The sources S of the first power transistor 22 are connected to a second plane-like portion 110-2 of the plane-like metal layer 110. The sources S of the second power transistor 24 are connected to a first plane-like portion 110-1 of the plane-like metal layer 110. The first and second plane-like portions 110-1 and 110-2 are electrically isolated.

The first contact portion 130-1 of the top plane-like metal layer 130 is connected to the second plane-like portion 110-2 of the plane-like metal layer 110. The second contact portion 130-2 of the top plane-like metal layer 130 is connected to the plane-like metal layer 124. The third contact portion 130-3 of the plane-like metal layer 130 is connected to the first plane-like portion 110-1 of the plane-like metal layer 110.

Figure 6A:
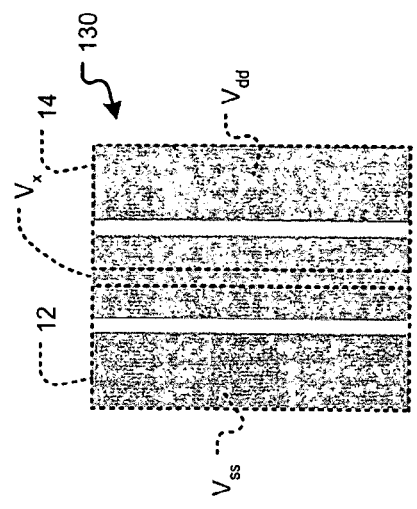
FIGS. 6A-6D are plan views of alternate layouts for a top metal layer of the power ICs in FIGS. 4 and 5.

Referring now to FIG. 6A, a plan view of a preferred embodiment of the top metal layer 130 is shown. A first contact portion 200 that is arranged in the top plane-like metal layer 130 includes a plurality of wings 202 that extend from a base portion 204. In one implementation, the first contact portion 200 is associated with $V_{ss}$ or $V_{dd}$ and the wings 202 extend in a perpendicular direction from the base portion 204. A second contact portion 210 that is arranged in the top plane-like metal layer 130 also includes a plurality of wings 212 that extend from a base portion 214. In one implementation, the second contact portion 210 is associated with $V_{dd}$ or $V_{ss}$ and the wings 212 extend in a perpendicular direction from the base portion 214.

One or more third contact portions 220 are located between the wings 202 and 212 of the first and second contact portions 200 and 210, respectively. In one implementation, the third contact portion 220 is associated with $V_x$ and the third contact portions 220 have a generally rectangular shape with rounded corners. The wings 202 and 212 reduce the impedance of the connection and increase heat dissipation. Additional contact portions 230 provide connections to control signals such as one or more gate control signals. The first, second and third contact portions substantially cover underlying transistor area. As used herein, substantially covering ⅓ means that each of the first, second and third contact portions cover ⅓ of the underlying area less spacing between the contact portions. In one embodiment, the first, second and third contact portions each cover about ⅓ of the underlying area less areas between the contact portions.

In a preferred embodiment, the IC has a length to width ratio that is greater than or equal to approximately 2:1. In a preferred embodiment, a plurality of fingers are employed. In the exemplary implementation, four fingers are used. The pitch between the fingers is preferably minimized to reduce resistance. The length of the IC is generally longer than the width to increase the number of fingers that can be employed. The combination of the increased number of fingers that are narrower reduces the resistance of the connection and increases heat dissipation. The use of global plane-like metal layers to connect the terminals of the transistors to the interconnect structure further reduces the resistance of the connections.

Figure 6B:
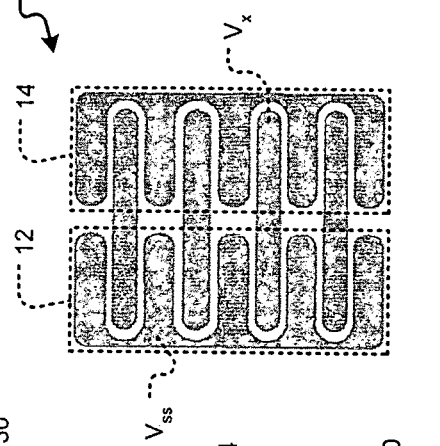

Referring now to FIG. 6B, the layout of the top plane-like metal layer 130 is shown relative to the underlying transistors 12 and 14. Approximately ⅓ of the area of the top plane-like metal layer 130 is assigned to each of $V_x$, $V_{ss}$ and $V_{dd}$. $V_x$, $V_{ss}$ and $V_{dd}$ are arranged in an interleaved manner as was described above in conjunction with FIG. 6A.

Figure 6C:
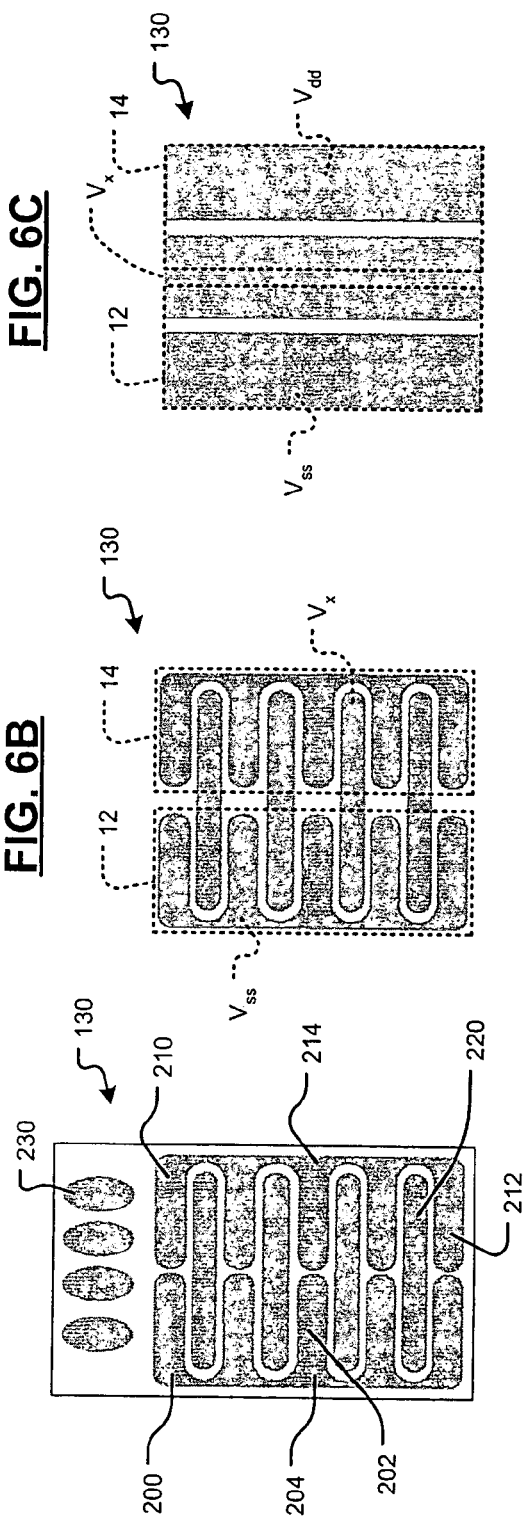

Referring now to FIG. 6C, an alternate layout for the top metal layer is shown. Approximately ⅓ of the area of the top plane-like metal layer 130 is assigned to each of $V_x$, $V_{ss}$ and $V_{dd}$ in a non-interleaved manner as was described above. This implementation is suitable for smaller power transistor applications.

Figure 6D:
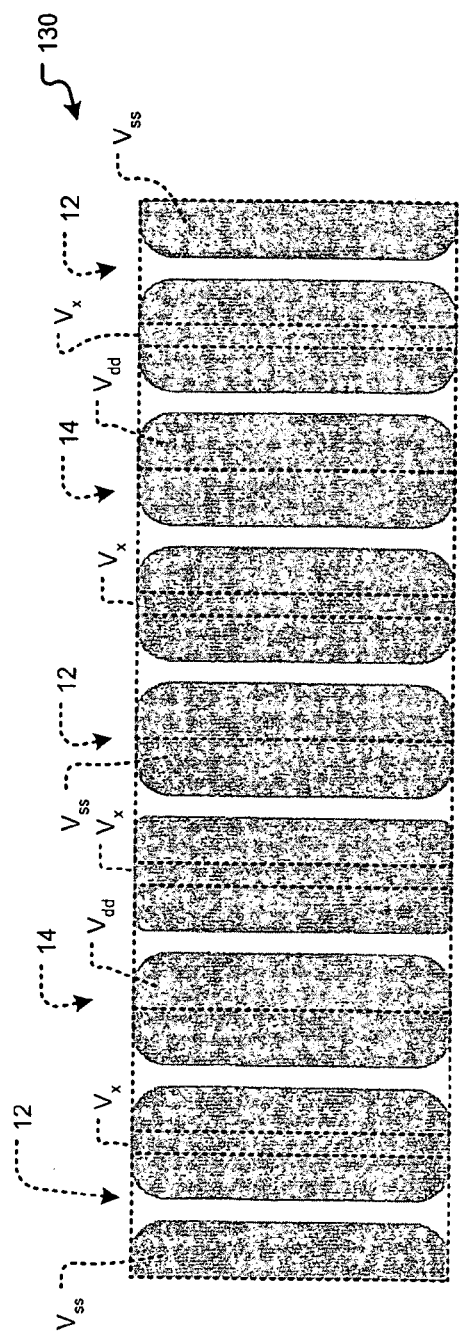

Referring now to FIG. 6D, the top plane-like metal layer 130 is shown for a power IC with additional transistors. As shown in FIG. 6D, approximately ⅓ of the area of the top plane-like metal layer 130 is assigned to each of $V_x$, $V_{ss}$ and $V_{dd}$ in a non-interleaved manner. The layout that is shown in FIG. 6D is particularly suitable when the $V_{ss}$ and $V_{dd}$ connections are made on one side and the $V_x$ connections are made on an opposite side of the power IC. While FIGS. 6A-6D were described in conjunction with transistors 12 and 14, transistors 22 and 24 and/or other types of transistors may also be used.

Figure 7:
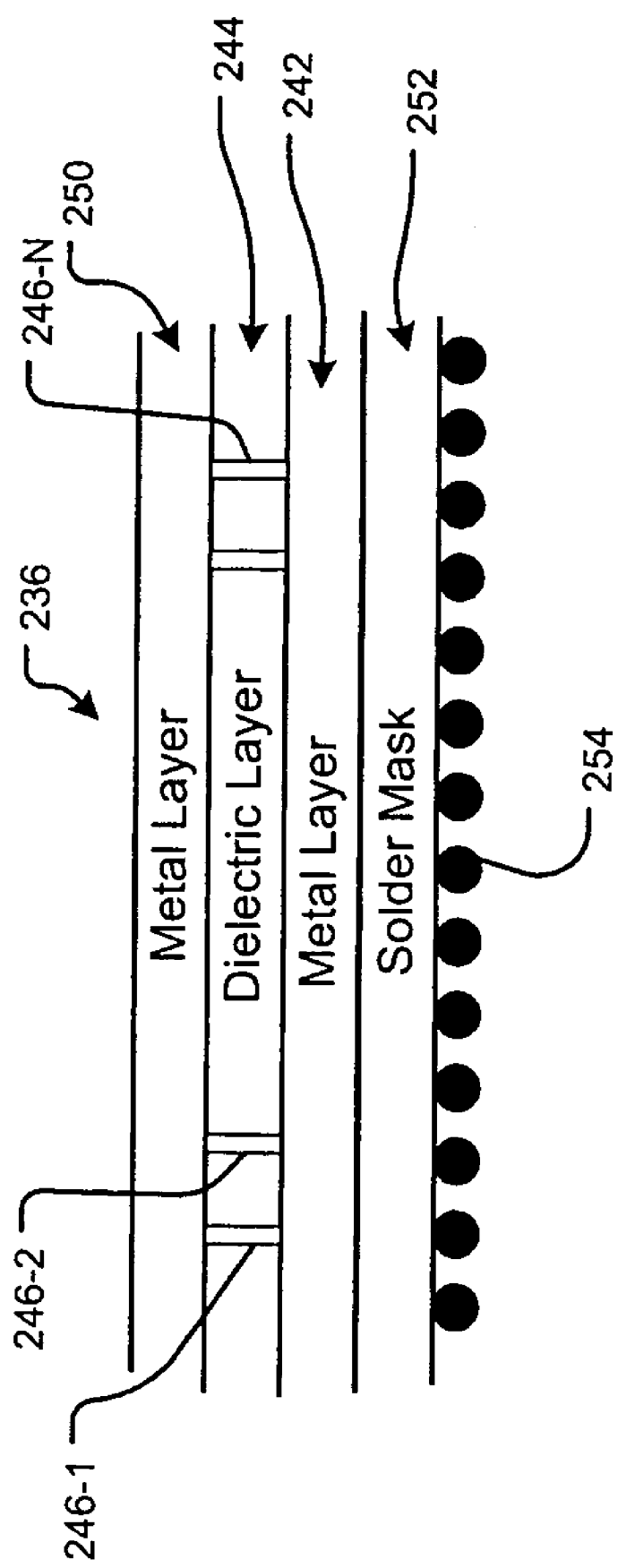
FIG. 7 is a cross sectional view illustrating layers of a first exemplary interconnect structure.

Referring now to FIG. 7, a first exemplary interconnect structure 236 is shown in further detail. The interconnect structure 236 may be used to connect one integrated circuit to another and/or to connect external components such as output circuits, capacitors, heat sinks, inductors, and/or other external components and/or structures. For example, the interconnect structure 236 may be used to connect the power IC to the drive IC in FIG. 2.

The interconnect structure 236 includes a dielectric layer 244 having a second metal layer and/or traces 242 arranged on one side thereof. A first or buildup metal layer 250 is built up on an opposite or outer side of the dielectric layer 244. Vias 246-1, 246-2, . . . , and 246-N (collectively 246) pass through the dielectric layer 244. A solder mask 252 is arranged over the second metal layer 242. Solder balls 254 are selectively used to connect portions of the first and/or second metal layer 250 and/or 242 to other electronic devices, as will be described below.

Figure 8B:
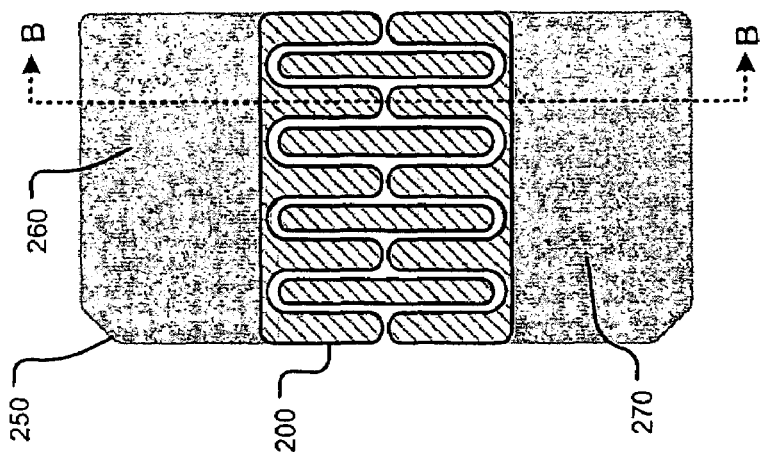
FIG. 8B is a plan view illustrating alignment of the top metal layer of the interconnect structure and the top metal layer of the IC.
Figure 8A:
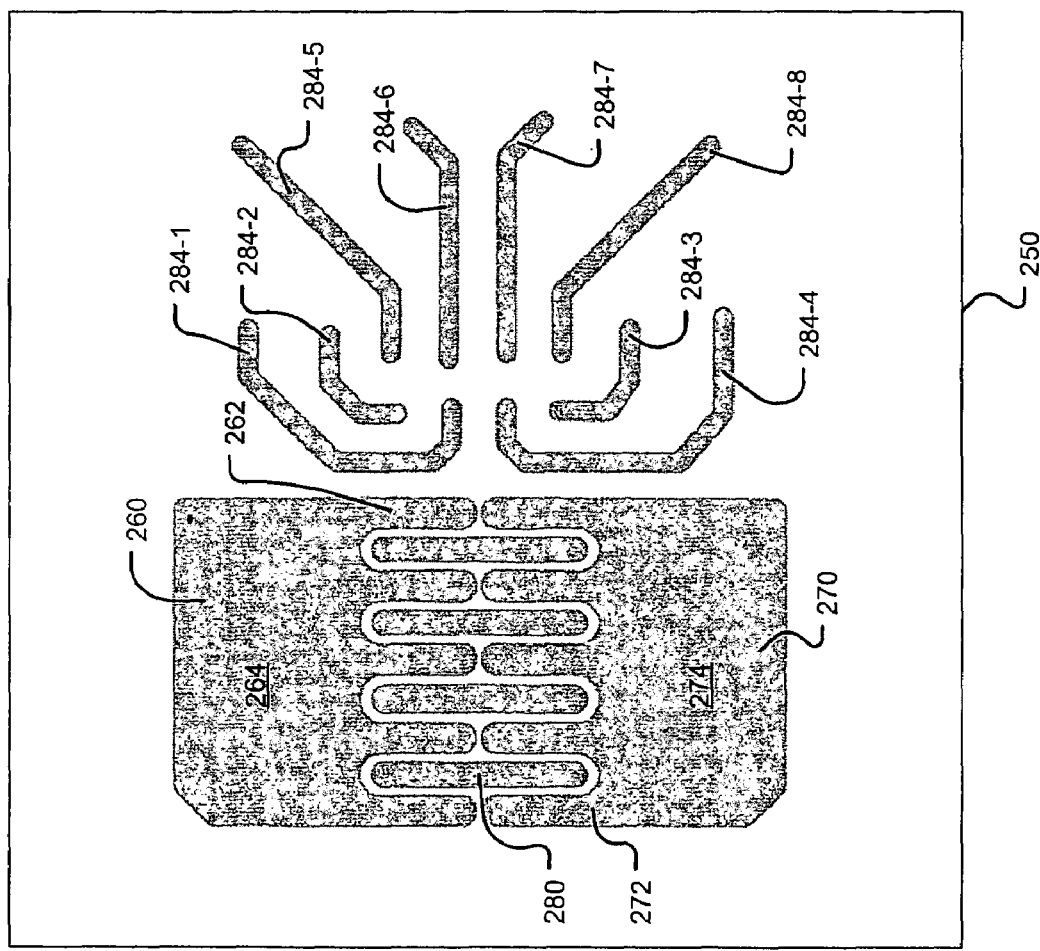
FIG. 8A is a plan view illustrating a top metal layer of the interconnect structure of FIG. 7.

Referring now to FIG. 8A, one exemplary embodiment of the metal buildup layer 250 is shown. The metal buildup layer 250 includes a first plane-like contact portion 260 that includes wings 262 that project from a base portion 264. The wings 264 have a shape and size that allows alignment with the wings 202 and/or 212 that are arranged on the metal layer 130 of the power IC 54. The metal buildup layer 250 includes a second plane-like contact portion 270 that includes wings 272 that project from a base portion 274. The wings 274 have a shape and size that also aligns with the wings 202 and/or that are arranged in the metal layer 130 of the power IC 54.

The metal buildup layer 250 includes one or more third plane-like contact portion(s) 280 that are located between wings 262 and 272 of the first and second plane-like contact portions 260 and 270, respectively. The third plane-like contact portions 280 also have a shape and size that also allows alignment with the third plane-like contact portions 220 that are arranged on the metal layer 130 of the power IC 54.

The metal buildup layer 250 also includes one or more additional contact portions 284 that provide control signal interconnects. One or more of the additional contact portions 284 may be associated with gate control signals. In one exemplary implementation, the buildup layer 250 is arranged by electroplating a conductive material such as copper onto the dielectric layer. Skilled artisans will appreciate that other materials and methods may be used. In one embodiment, the buildup layer 250 has a minimum thickness of approximately 15 μm and an average thickness of approximately 18 μm, although other thicknesses may be employed.

Referring now to FIG. 8B, the metal buildup layer 250 of the interconnect structure 236 is shown relative to the top metal layer 130 of the power IC. As can be appreciated, the two structures substantially align with each other and overlap. However, the metal buildup layer 250 may extend beyond the top metal layer 130 of the power IC to reduce resistance and to increase heat dissipation.

Figure 9:
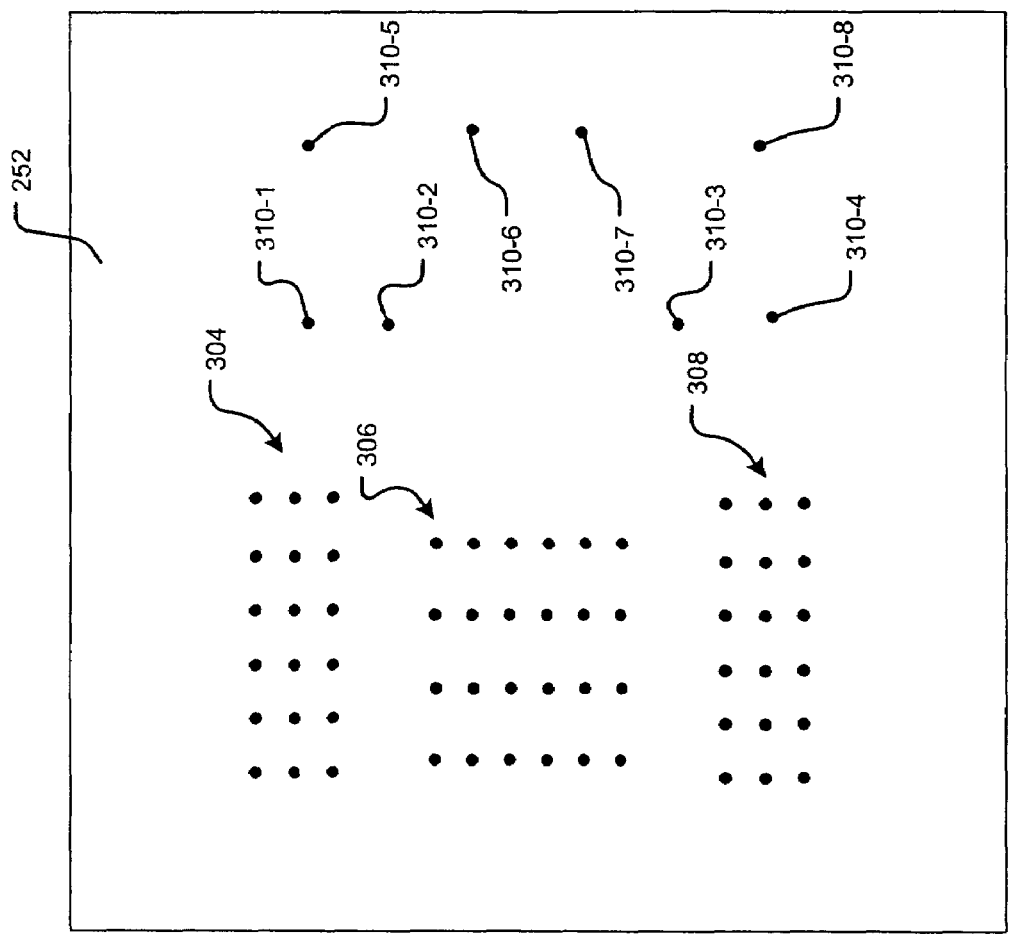
FIG. 9 is a plan view of a dielectric layer of the interconnect structure of FIG. 7.

Referring now to FIG. 9, the dielectric layer 252 is shown in further detail. The dielectric layer 252 includes a set of vias 304 that align with the body 264 of the first portion 260. The dielectric layer 252 includes a set of vias 308 that align with the base portion 264 of the second plane-like contact portion 270. The dielectric layer 252 also includes a set of vias 306 that align with the third plane-like contact portions 280. In an exemplary embodiment, the set of vias 306 are arranged in rows and each of the third plane-like contact portions 280 includes a row of the vias 306. Additional vias 310-1, 310-2, . . . , 310-8 are provided and align with the additional portions 284-1, 284-2, . . . , 284-8 arranged in the metal buildup layer 250. In one exemplary implementation, the vias in the core dielectric layer 252 are 57 μm solid copper vias.

Figure 10:
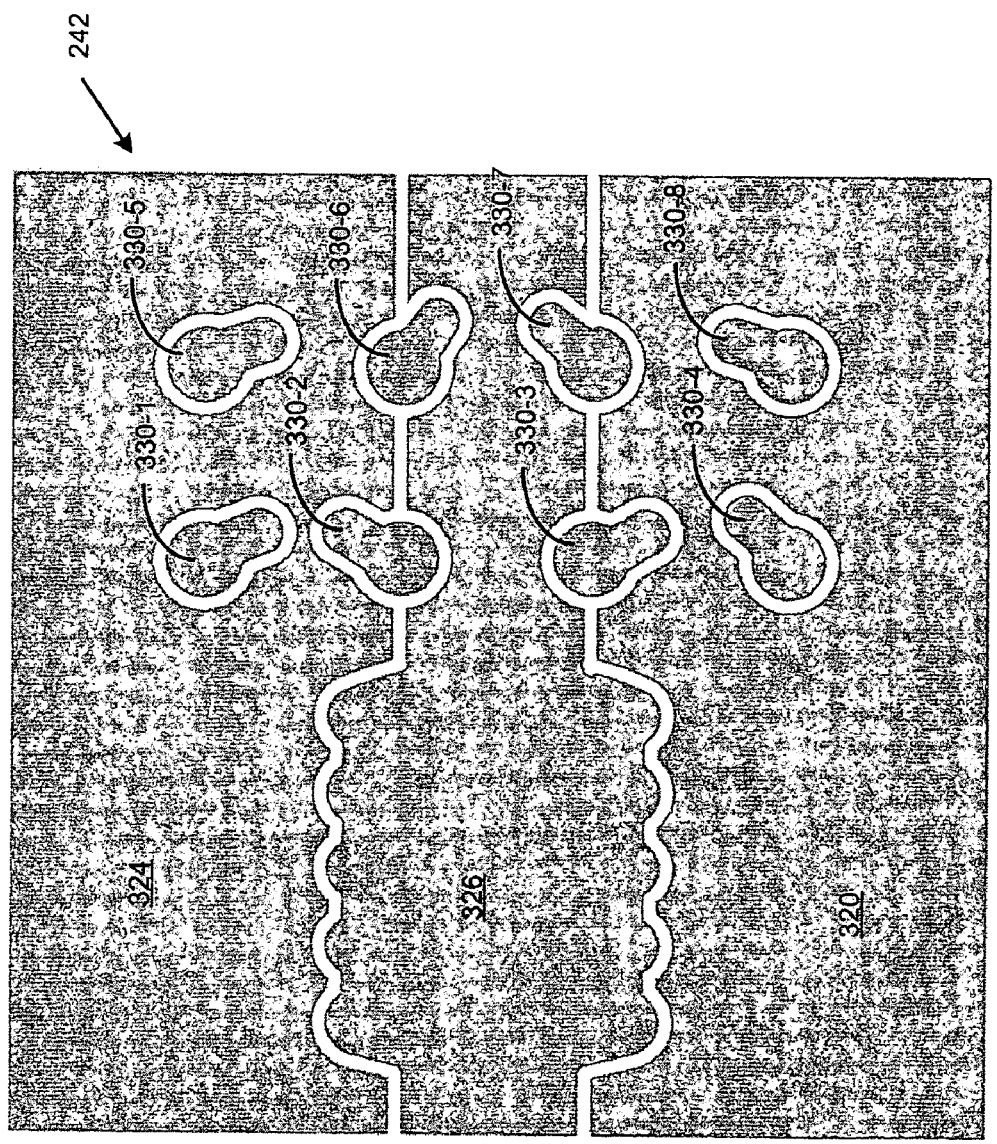
FIG. 10 is a plan view of a metal layer of the interconnect structure of FIG. 7.

Referring now to FIG. 10, an exemplary implementation of the metal layer 242 is shown in further detail. The metal layer 242 includes a first plane-like conducting portion 320 that is in electrical contact with the set of vias 308. The metal layer 254 includes a second plane-like conducting portion 324 that is in electrical contact with the set of vias 304. The metal layer 254 includes a third plane-like conducting portion 326 that is in electrical contact with the set of vias 306. The metal layer 254 includes an additional plane-like conducting portions 330-1, 330-2, 330-3, . . . , 330-8 that are in electrical contact with the vias 310-1, 310-2, 310-3, . . . , 310-8. In a preferred embodiment, the additional plane-like conducting portions 330 are generally pear-shaped, although other shapes maybe used. As used herein, the term "generally" means approximately and may include rounding of corners and other variations from the shape. The plane-like conducting portions in FIG. 10 are electrically isolated from each other.

Figure 11:
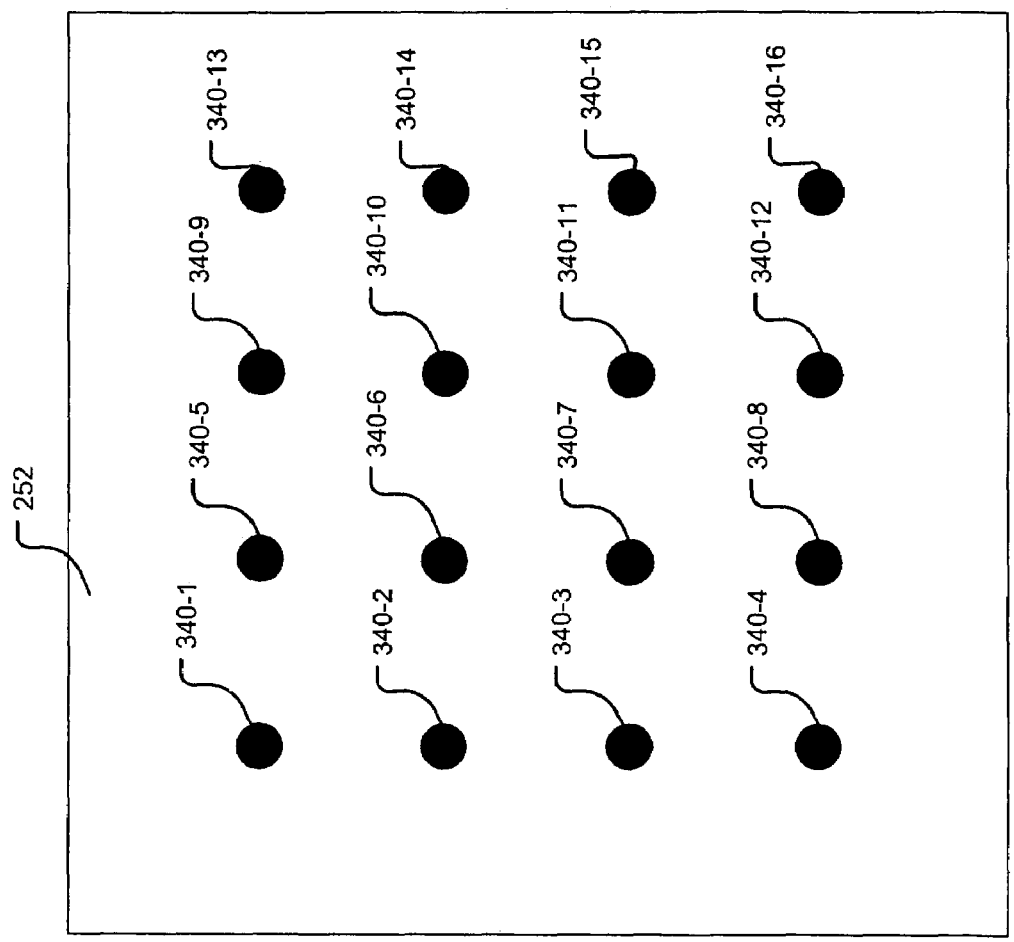
FIG. 11 is a plan view of a solder mask layer of the interconnect structure of FIG. 7.

Referring now to FIG. 11, a dielectric layer forms the solder mask 252 and includes openings 340-1, 340-2, . . . , and 340-16, which receive solder balls that are used to attach the interconnect structure 236 to other electronic devices. In one exemplary implementation, the openings have a 1.0 mm ball pitch, although other ball pitches may be used.

Figure 12:
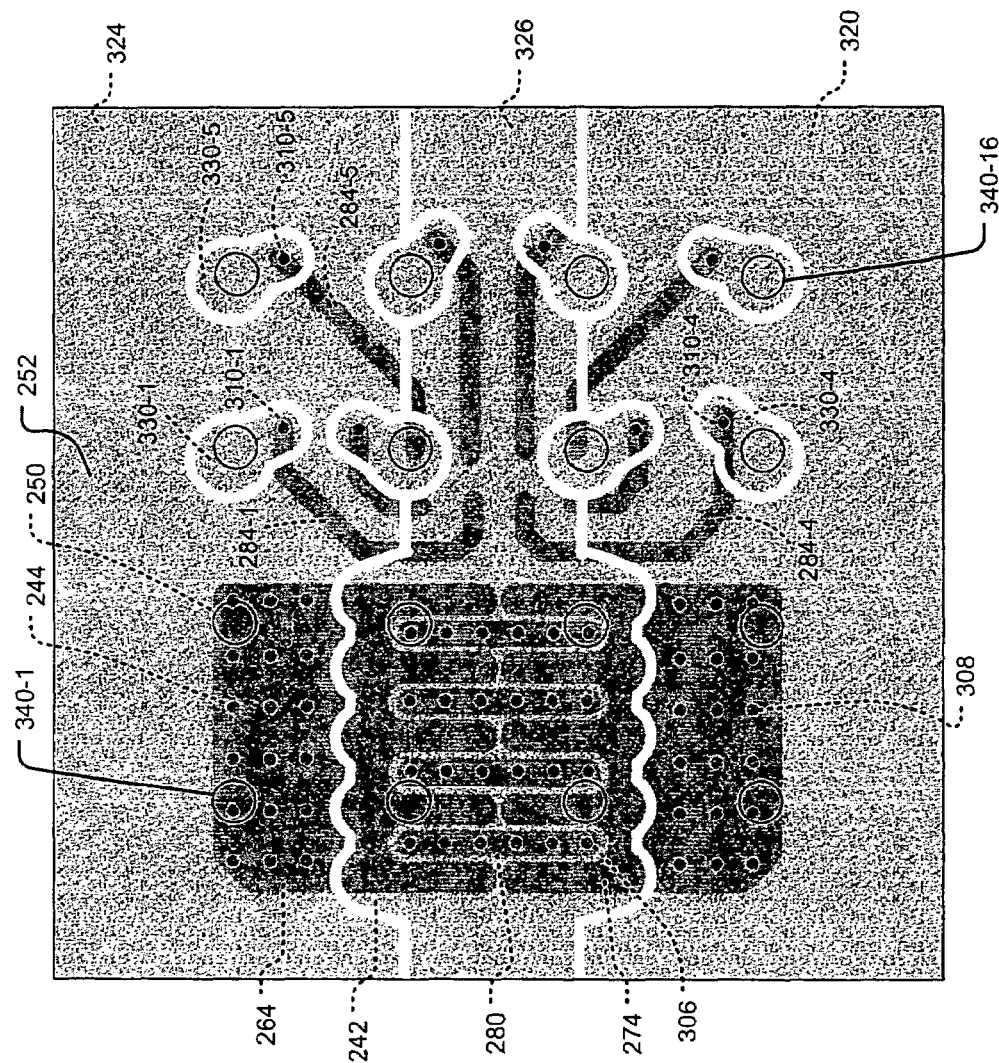
FIG. 12 illustrates alignment and orientation of the layers shown in FIGS. 7-11.

Referring now to FIG. 12, alignment of the metal buildup layer 250 relative to the dielectric layer 244 of FIG. 9, the metal layer 242 of FIG. 10 and the solder mask 252 of FIG. 11 is shown.

Figure 13:
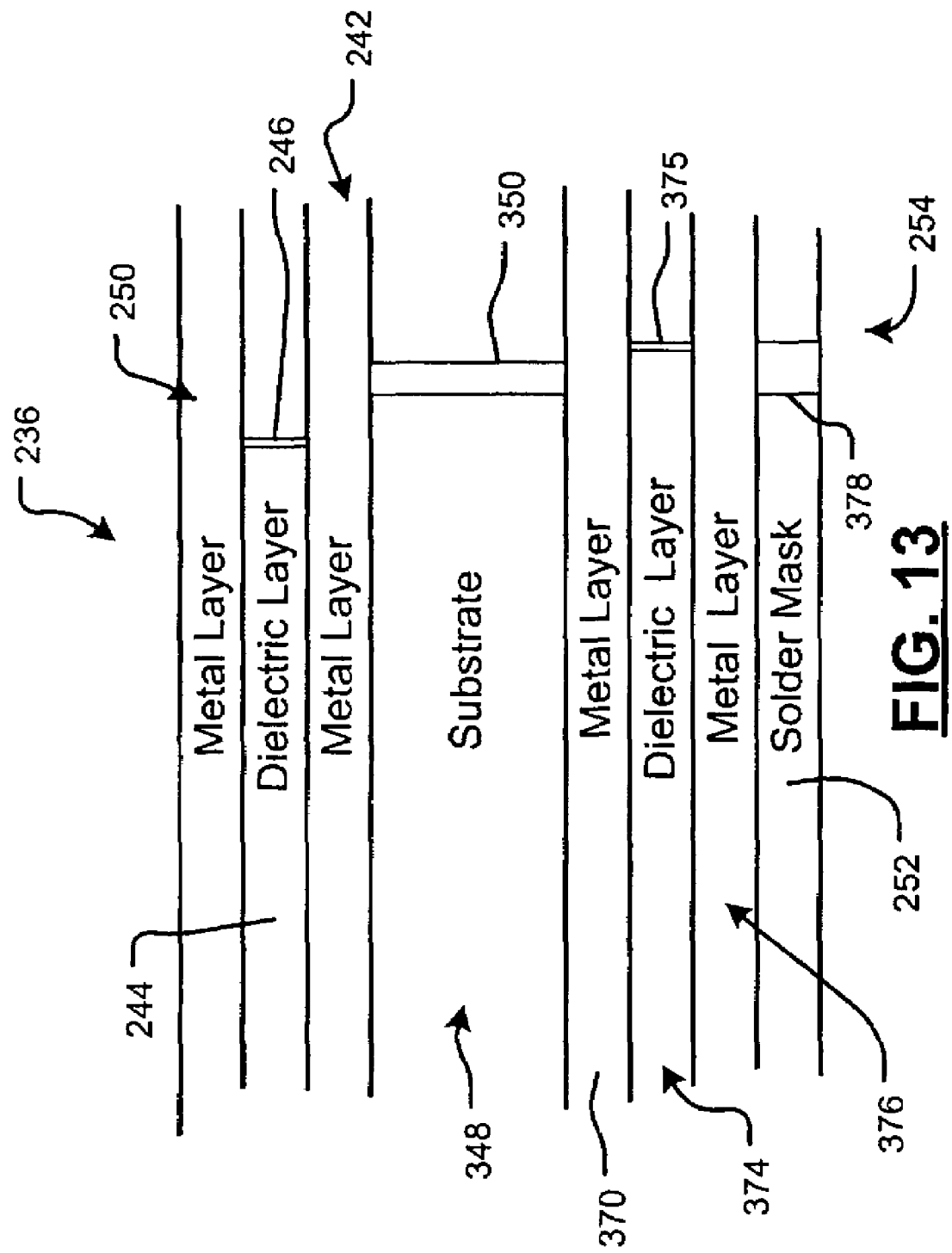
FIG. 13 illustrates layers of a second exemplary interconnect structure.

Referring now to FIG. 13, the interconnect structure 236 can be designed with additional metal and dielectric layers to provide structural support and/or to prevent warpage due to thermal expansion and contraction. The interconnect structure in FIG. 13 includes the layers that are shown and described in conjunction with FIGS. 7-12, however, additional layers are provided between the second metal layer 242 and the solder mask 252.

The interconnect structure 236 includes a substrate 348 with plated through holes (PTH) 350, which provide a connection from the metal layer 242 to a metal layer 370. The metal layer 370 is arranged on an opposite side of the substrate 348. A dielectric layer 374 is arranged adjacent to the metal layer 370 and includes vias 375, which provide a connection from the metal layer 370 to a metal layer 376. The metal layer 376 is arranged on an opposite side of the dielectric layer 374. In one implementation, the metal layer 370 has a structure that is similar to the metal layer 242 that is shown in FIG. 10. The solder mask layer 252 is arranged on an opposite side of the metal layer 376. Openings 378 in the solder mask layer 252 allow solder balls 254 to provide connections to other electronic devices.

The metal layers are 250, 242, 370 and 376 are preferably formed using copper, aluminum or any other suitable conductive material. The metal layers 354 and/or 350 can be traces that are etched and/or otherwise formed on the substrate 348. The metal layers 250 and 376 can be buildup layers that are formed by electroplating.

Figure 14:
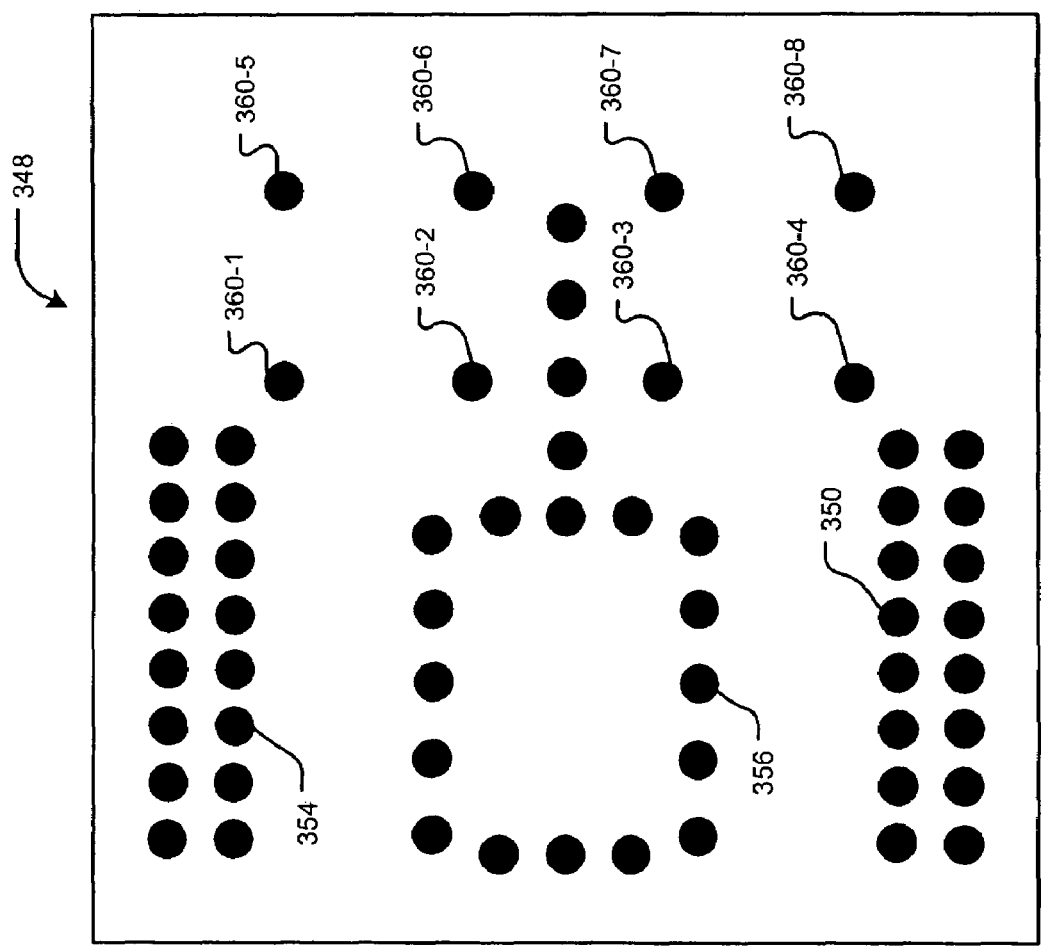
FIG. 14 is a plan view of a core dielectric layer with plated through holes (PTHs)
Figure 15:
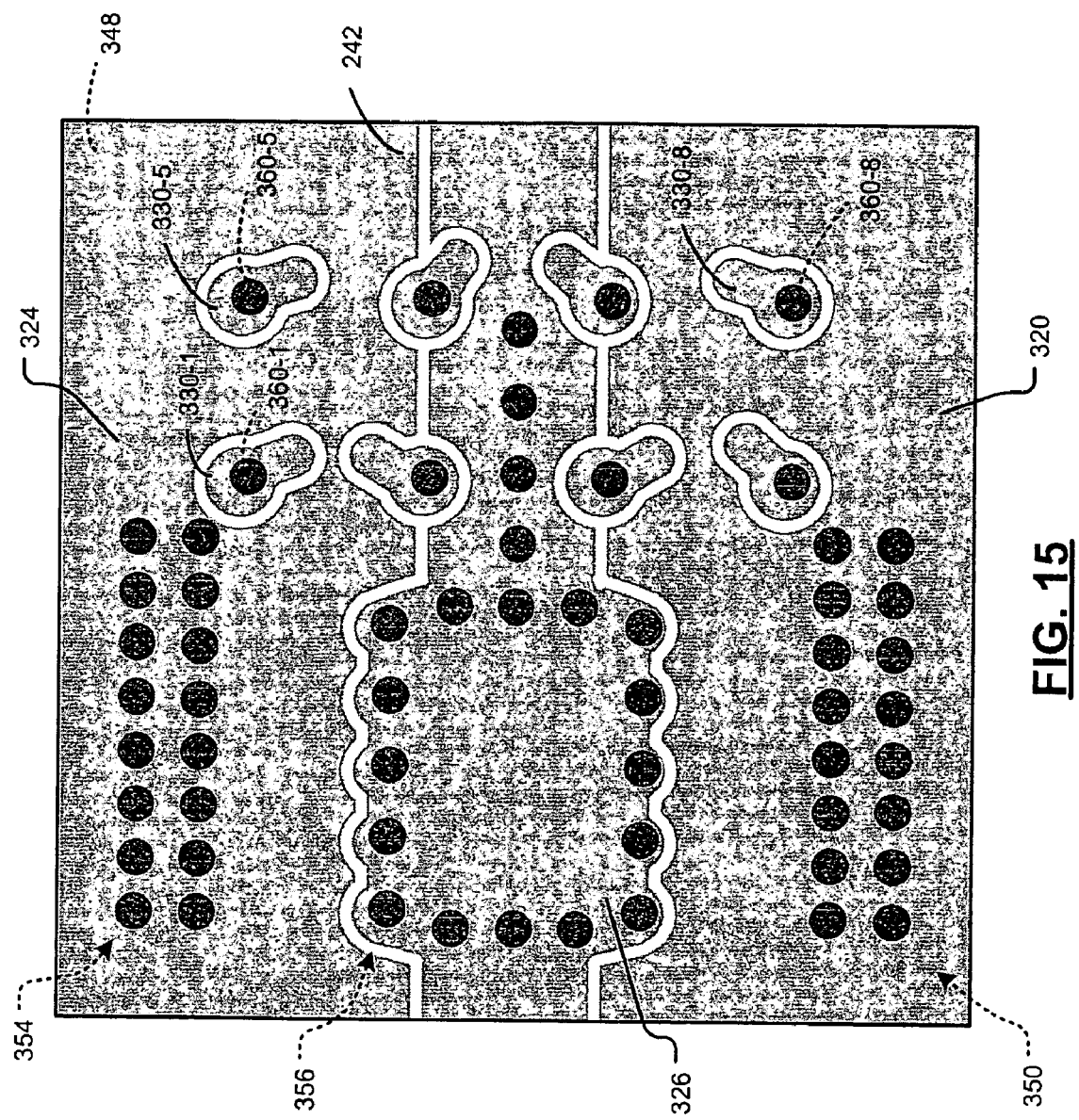
FIG. 15 illustrates alignment of the plated through holes of the core dielectric layer (shown on bottom) and an additional metal layer (shown on top) that is similar to the layer shown in FIG. 10.

Referring now to FIGS. 14 and 15, in one exemplary implementation, the substrate 348 includes a first set of PTH 350 that are electrically connected to and aligned with the first plane-like conducting portion 320 in FIG. 10. A second set of PTH 354 are electrically connected to and aligned with the second plane-like conducting portion 324 in FIG. 10. A third set of PTH 356 are electrically connected to and aligned with the third plane-like conducting portion 326 in FIG. 10. The substrate 348 further includes other PTHs 360-1, 360-2, . . . , and 360-8 that are electrically connected to and aligned with the additional plane-like portions 330-1, 330-2, . . . , 330-8. In a preferred embodiment, the PTH have a diameter of 200 μm with 15 μm minimum and 18 μm average plating wall thickness. In FIG. 15, the alignment of the substrate 348 (on bottom) is shown relative to the metal layer 242 (on top).

Figure 16:
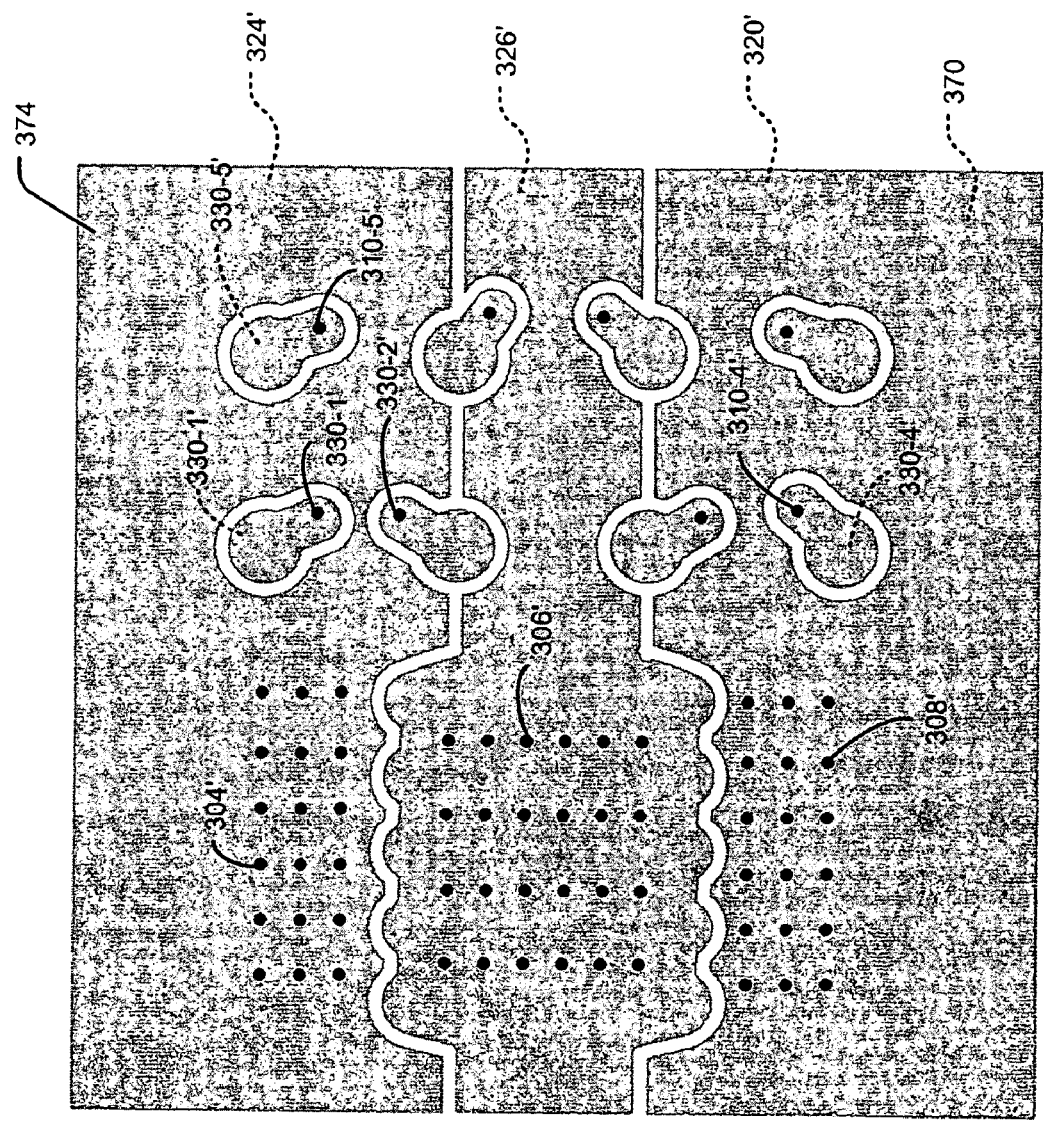
FIG. 16 illustrates alignment of the metal layer of FIG. 15 (shown on bottom) and vias in an additional dielectric layer (similar to that shown in FIG. 9) (shown on top)

Referring now to FIG. 16, the alignment and orientation of the dielectric layer 374 (on top) and the metal layer 370 (on bottom) is shown. The alignment and orientation is similar to the dielectric layer 244 and the metal layer 242 that are shown in FIG. 12. Since the dielectric layers 244 and 374 are similar, the same reference numerals are used followed by "'". A similar approach will be used for the metal layers 242 and 370.

Figure 17:
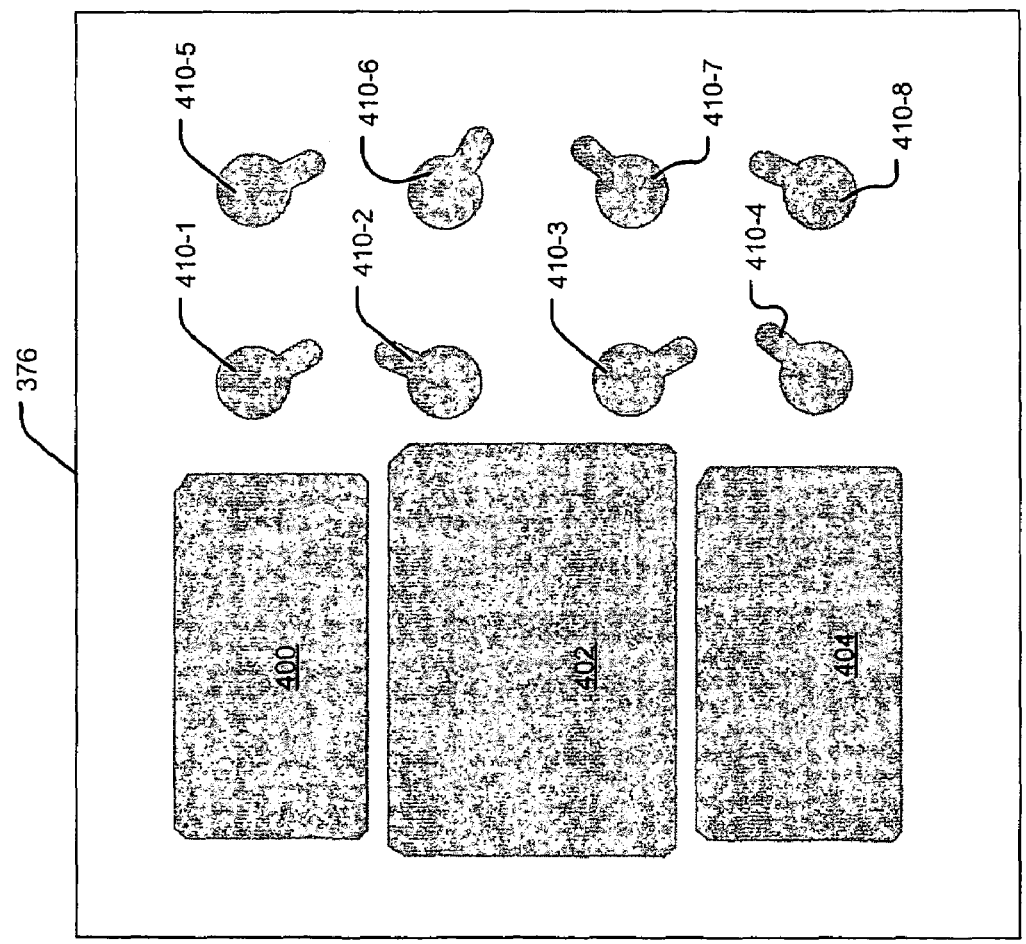
FIG. 17 is a plan view illustrating a metal layer.

Referring now to FIG. 17, the bottom metal layer 376 is shown in further detail and includes first, second and third plane-like conducting portions 400, 404 and 406. In a preferred embodiment, the plane-like conducting portions 400, 404 and 406 have a generally rectangular shape, although other shapes may be used. Additional plane-like conducting portions 410-1, 410-2, 410-3, . . . , 410-8 are also provided. The additional conducting portions 410-1, 410-2, 410-3, . . . , 410-8 have a generally pear-shaped cross-section, although other shapes may be used.

Figure 18:
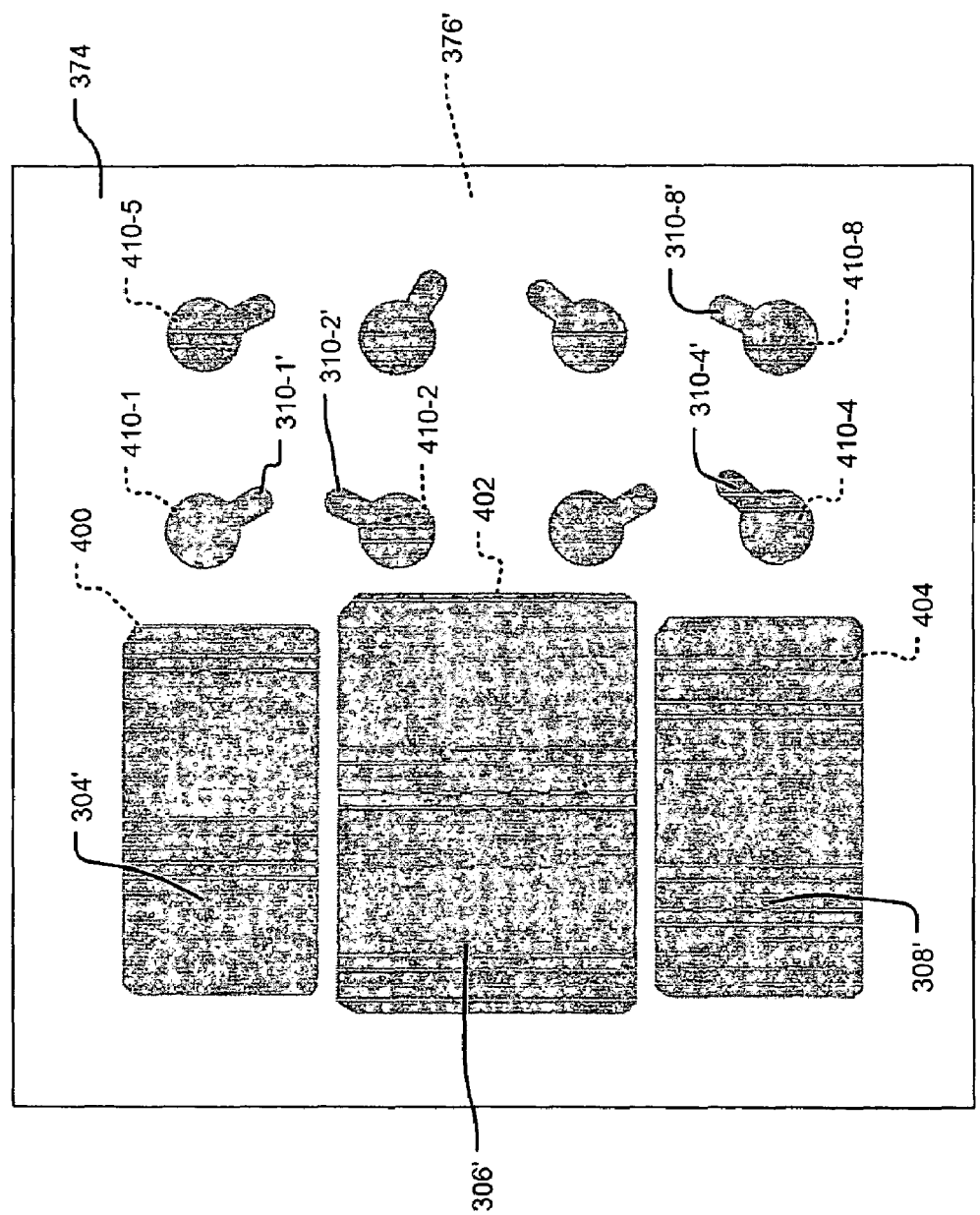
FIG. 18 illustrates alignment of the vias of the dielectric layer of FIG. 16 (shown on bottom) and the metal layer of FIG. 17 (shown on top)

Referring now to FIG. 18, alignment and interconnection of the vias 304', 306', 308' and 310-1', 310-2', . . . , and 310-8' on the dielectric layer 374 (on top) are shown relative to the plane-like portions of the metal layer 376 (on bottom). The conducting portions preferably have a minimum thickness of 15 μm and an average thickness of 18 μm.

The vias 308' connect the first portion 320' of the metal layer 370 and the plane-like conducting portion 404 of the metal layer 376. The vias 304' connect the second portion 324' of the metal layer 370 and the plane-like conducting portion 404 of the metal layer 376. The vias 306' connect the third portion 326' of the metal buildup layer 370 and the plane-like conducting portion 402 of the metal layer 376. Additional vias 310-1', 310-2', . . . , 310-8' connect the additional portions 330-1', 330-2', . . . , 330-8' of the metal layer 370 to additional portions 410 of the metal layer 376.

Figure 19:
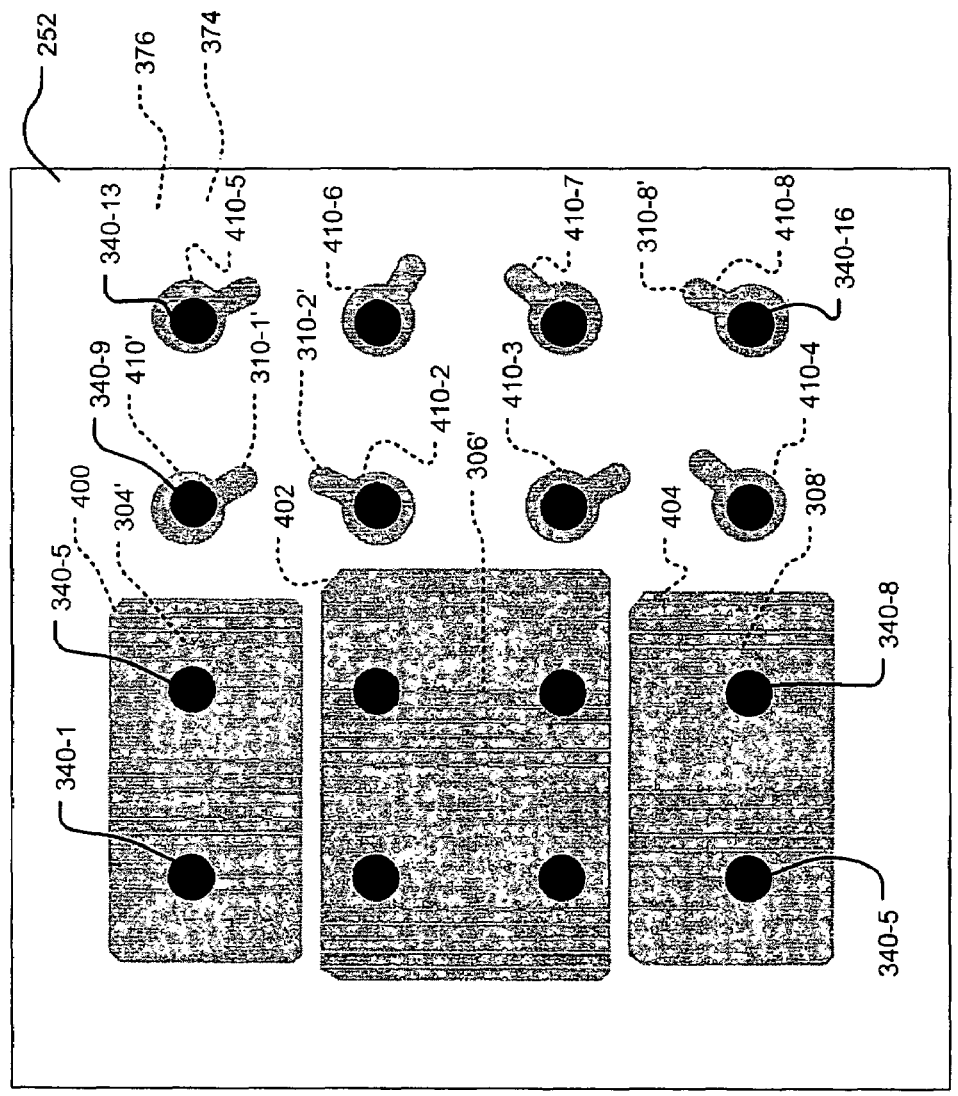
FIG. 19 illustrates alignment of the layers of FIG. 18 and the solder mask layer of FIG. 11.

Referring now to FIG. 19, the solder mask layer 252 is shown on top of the metal layer 376 and the dielectric layer 374. Alignment of the openings 340-1', 340-2', . . . , 340-16' are shown relative to the plane-like portions of the metal layer 376.

Referring now to FIGS. 20 and 21, additional layouts for the top metal buildup layer 250 are shown. As can be seen in FIGS. 20 and 21, the top metal layer of the power IC aligns with the top metal buildup layer. The top metal layer of the power IC may be a mirror image of the top metal buildup layer. Alternately, the top metal layer of the power IC may partially align with the top metal buildup layer as shown by dotted lines in FIGS. 20 and 21. The top metal buildup layer may extend beyond the aligned top metal layer of the power IC to reduce resistance and increase heat dissipation.

In FIG. 20, $V_{dd}$ is associated with a first outer contact portion 412, which has a generally "C"-shaped configuration. $V_{ss}$ is associated with a second outer contact portion 414, which also has generally "C"-shaped configuration. A middle contact portion 418 is located between the first and the second outer contact portions 412 and 414, respectively. One or more additional contact portions 419 may be arranged along one or more sides or ends of the buildup layer 250 and/or between contact portions 412 and 414 to accommodate control signals, such as gate control signals.

Referring now to FIG. 21, another layout for the top metal buildup layer 250 is shown. $V_{dd}$ is associated with a first outer portion 422, which has a generally rectangular configuration. $V_{ss}$ is associated with a second outer portion 424, which has generally rectangular configuration. A middle portion 428 is located between the first and second outer portions 422 and 424, respectively. One or more additional portions 430 may be arranged along one or more sides or ends of the buildup layer 420 to accommodate control signals, such as gate control signals.

Referring now to FIG. 22, a decoupling capacitor 440 can be attached to the interconnect structure 236 between $V_{dd}$ and $V_{ss}$ in addition to an IC 444, which is mounted on the metal buildup layer 250 of the interconnect structure 236. The decoupling capacitor 440 includes first and second conducting plates 450 and 452 that are separated by an insulating material 456. The plates 450 and 452 are connected by conductive arms 460 and 462, respectively, to the interconnect structure 236. In one implementation, the conductive arms 460 and 462 are connected to $V_{dd}$ and $V_{ss}$. Ends of the arms 460 and 462 are connected to the buildup layer 250 of the interconnect structure 236. Since the buildup layer 250 is relatively thin, it has a relatively high impedance. In one embodiment, the arms 460 and 462 have a generally "L"-shaped configuration.

Referring now to FIG. 23, an IC 472 is connected by solder balls 474 to the buildup layer 250 of the interconnect structure 236. Additional metal layers 480-1 and 480-2 or bars are formed on the buildup layer 250 to increase strength and reduce the impedance thereof. In a preferred embodiment, the metal layers 480 are formed of copper. Short parasitic resistances 482-1 and 482-2 connect a capacitor 484 to the interconnect structure 236.

Referring now to FIGS. 24A, 24B, and 24C, one or more heat sinks can also be arranged on the metal buildup layer 250 of the interconnect structure 236 to dissipate heat. An integrated circuit (IC) 501, such as the power IC described above, is connected to the interconnect structure 236 in any suitable fashion such as adhesive, solder ball grid arrays, etc. In FIG. 24A, heat sinks 500-1 and 500-2 include a base portion 502 with a plurality of outwardly projecting fins 504. The base portion 502 is connected to the metal buildup layer 250. The fins 504 provide an increased surface area to exchange heat with surrounding air, which dissipates heat. In an alternate embodiment, the heat sink 502 does not include the fins 504.

In FIG. 24B, one surface of the IC 501 is connected to the interconnect structure 236 and an opposite surface is connected by a solder ball grid array 509 to one end of a heat sink strap 510. Another end of the heat sink strap 509 can also be connected to the metal buildup layer 250 of the interconnect structure 236, for example using solder balls. A stiffening bar 514 may be connected to one of the contact portions of the metal buildup layer to increase stiffness.

In FIG. 24C, one end of a heat sink strap 520 is connected to the interconnect structure using solder, adhesive, or any conventional method. A stiffening bar 514 provides a reinforced connection point for connecting the opposite end of the heat sink strap 520.

Referring now to FIGS. 25A and 25B, an alternate interconnect structure 600 includes a patterned Aluminum (Al) core. The Aluminum core is patterned using a series of masking steps and exposure to at least one of porous and/or dense anodization from one or both sides. If the patterning is done from both sides, the Aluminum core preferably has a thickness that allows anodization to be performed completely through the Aluminum core when two-sided patterning is performed.

The Aluminum core in FIG. 25A is patterned to define $V_{ss}$, $V_x$, $V_{dd}$ and gate regions 604, 606, 608, and 610, respectively. When the Aluminum core is used as an interconnect structure 600, however, the interconnect structure may be brittle. One or more inverted vias and/or buildup layers 614 are formed on the regions 604, 606, 608, and 610. In a preferred embodiment, the vias and/or buildup layers 614 are formed of Copper that is electroplated onto the aluminum core.

A stiffening material 616 is applied in between the inverted vias 614 to provide additional structural support. The stiffening material 616 is preferably non-conductive. In one embodiment, the stiffening material is epoxy. The stiffening material may end below the inverted vias and/or buildup layers 614, at a plane that is equal to the vias and/or buildup layers 614 and/or above the vias and/or buildup layers 614. Solder balls 620 are used to connect the inverted vias and/or buildup layers 614 to an integrated circuit such as a power IC and/or drive circuit. A similar structure may be used on an opposite side of the interconnect structure.

Referring now to FIG. 26, an alternate interconnect structure 630 includes pads 634 that are formed on the regions 604, 606, 608, and 610. The stiffening material 616 such as epoxy encases the pads 634 and an outer surface of the aluminum core to provide insulation and to increase stiffness.

Referring now to FIGS. 27A and 27B, an additional layout of the interconnect structure 650 with an Aluminum core is shown. To simplify FIG. 27A, the gate connections and solder balls are omitted. The interconnect structure 650 includes an Aluminum core with patterned $V_{ss}$, $V_x$, and $V_{dd}$ regions 652, 654 and 656. A stiffening material 660 is applied between the regions 652, 654 and 656 to increase stiffness as shown in prior FIGs. Inverted vias and/or buildup layers 664 are formed on the Aluminum core. The vias and/or buildup layers are preferably formed using electroplated Copper although other methods and material can be used. Solder balls 620 provide a connection from the vias and/or buildup layers 664 to an integrated circuit, such as the power IC and/or drive circuit.

Figure 28A:
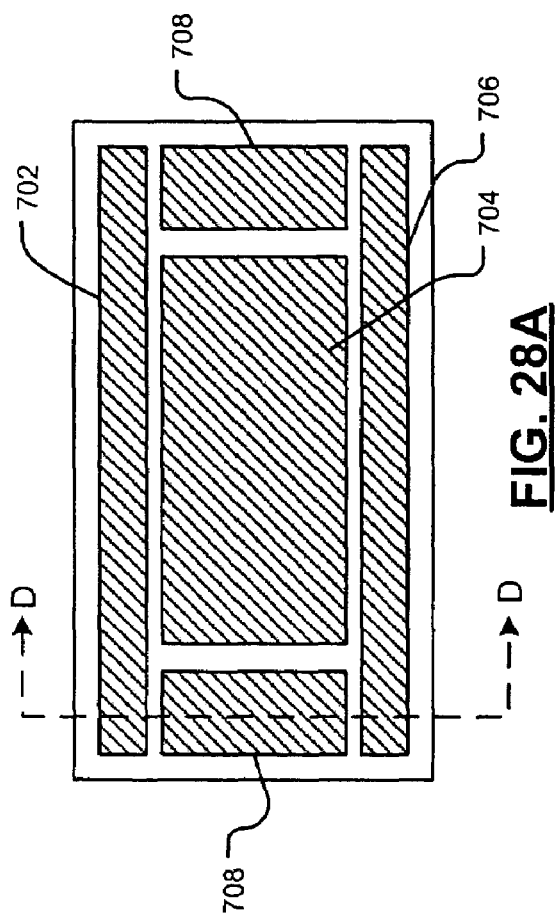
FIGS. 28A and 28B are a plan view and a cross-sectional view (taken along line D-D in FIG. 27B), respectively, of a third alternate exemplary layout for the interconnect structure with an aluminum core.
Figure 28B:
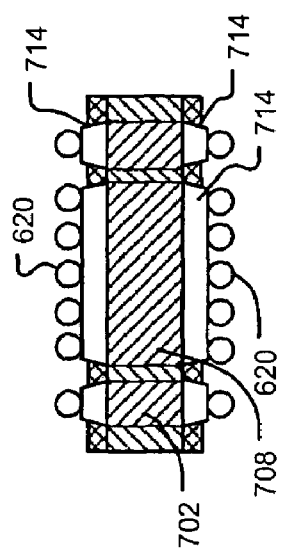

Referring now to FIGS. 28A and 28B, an additional layout of the interconnect structure 700 with an Aluminum core is shown. The interconnect structure 700 includes an Aluminum core with patterned $V_{ss}$, $V_x$, $V_{dd}$ and gate regions 702, 704, 706 and 708. A stiffening material 710 is applied between the regions 702, 704 and 706 to increase stiffness as shown in prior FIGs. Inverted vias and/or buildup layers 714 are formed on the Aluminum core. The vias and/or buildup layers 714 are preferably formed using electroplated Copper although other methods and materials can be used. Solder balls 620 provide a connection from the vias and/or buildup layers 714 to an integrated circuit, such as the power IC and/or drive circuit.

Referring now to FIGS. 29A and 29B, an IC 800 such as a power IC is shown and includes a pair of transistors $Q_1$ and $Q_2$. The transistors $Q_{1\ and\ Q2}$ include a control terminal and first and second terminals. In FIG. 29B, a leadframe 810 defines transmission lines or planes 812-1, 812-2, and 812-3 (collectively transmission lines 812) that minimize parasitic inductance. In FIG. 29B, cross-hatched areas correspond to connections between the transmission lines or planes 812 and the top metal layer of the IC. In one embodiment, the leadframe 810 includes a mold compound that encapsulates the transmission lines 812 and the IC 800. The IC 800 preferably has a layout that is similar to that shown in FIGS. 1B and 4B. While PMOS and NMOS transistors with gates, sources S and drains D are shown, other types of transistors may be used.

Figure 30B:
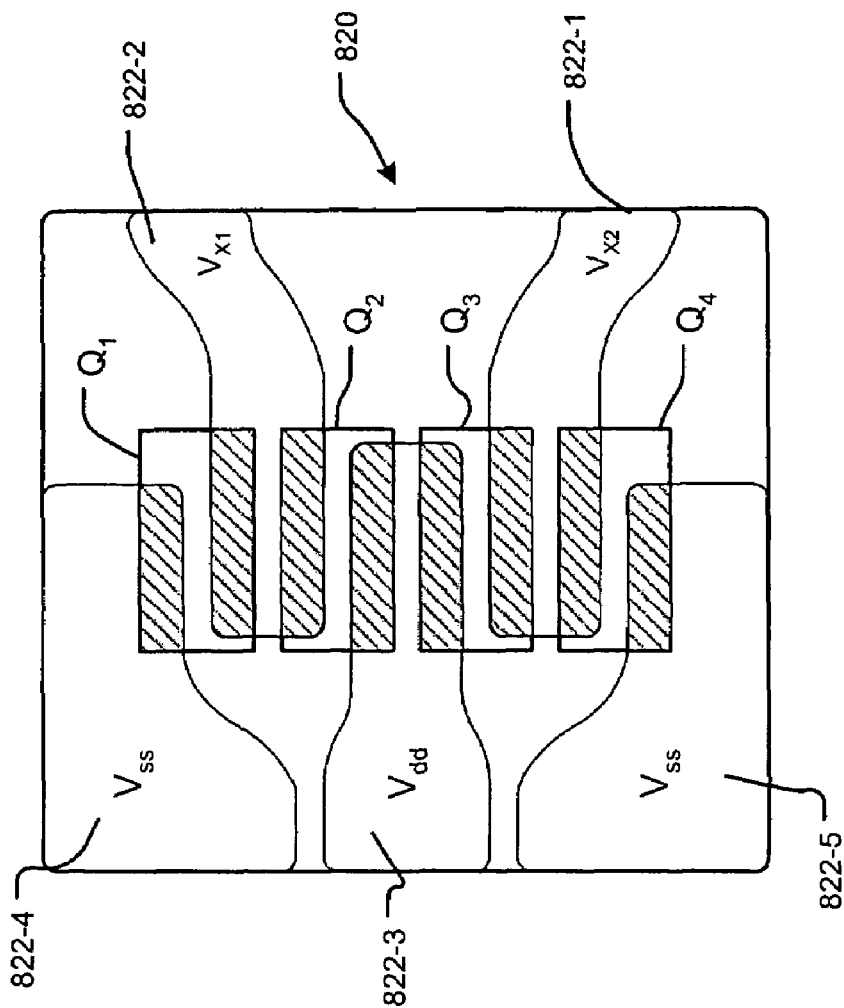
FIG. 30B is a plan view of a leadframe that includes transmission lines that are connected to the power IC of FIG. 30A.
Figure 30A:
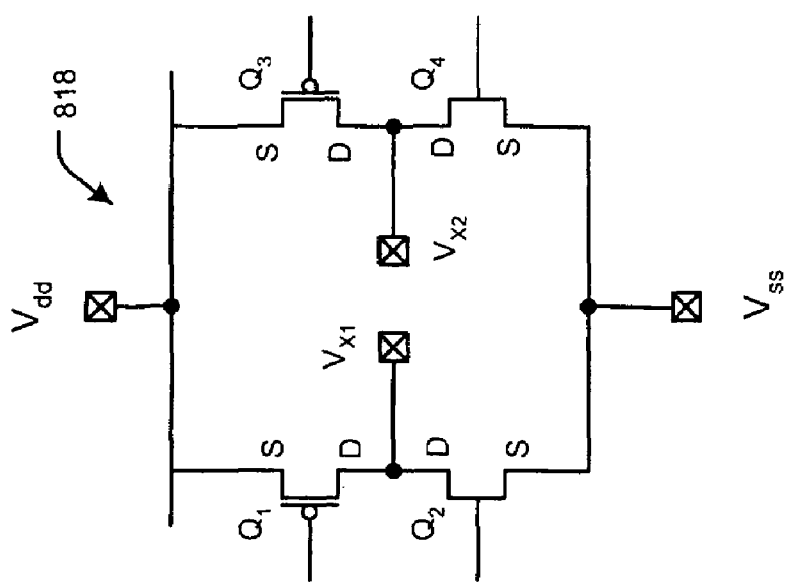
FIG. 30A is an electrical schematic of another exemplary power IC.

Referring now to FIGS. 30A and 30B, an IC 818 such as a power IC is shown and includes transistors $Q_1$, $Q_2$, $Q_3$, and $Q_4$. The transistors $Q_1$, $Q_2$, $Q_3$, and $Q_4$ include a control terminal and first and second terminals. A leadframe 820 includes transmission lines or planes 822-1, 822-2, 822-3, 822-4 and 822-5 (collectively transmission lines 822) that are connected to the IC 818. Some of the transmission lines 822 may be connected in parallel to the IC 818. For example, in one implementation the transmission line 822-3 supplies $V_{dd}$ to both a first transistor pair $Q_{1\ and\ Q2}$ and a second transistor pair $Q_3$ and $Q_4$. Transmission lines 822-1 and 822-2 receive outputs of the first pair $Q_1$ and $Q_2$ and the second pair $Q_3$ and $Q_4$, respectively. In FIG. 30B, cross-hatched areas correspond to connections between the transmission lines or planes 822 and the top metal layer of the IC 818. The IC 818 may have a layout that is similar to that shown in FIG. 4B. While PMOS and NMOS transistors with gates, sources S and drains D are shown, other types of transistors may be used.

Referring now to FIG. 31, a leadframe 840 for an IC such as a power IC with additional pairs of transistors is shown.

Input transmission lines or planes 844-I (for example corresponding to outputs $V_{ss}$ and $V_{dd}$) are arranged along one side of the leadframe 840. Output transmission lines 844-O (for example corresponding to outputs $V_{X1} \ldots V_{X4}$) are arranged along an opposite side of the leadframe 840. The transmission lines or planes and the IC may be encapsulated in a mold compound 850. Cross-hatched areas correspond to connections between the transmission lines or planes 812 and the top metal layer of the IC.

Figure 32A:
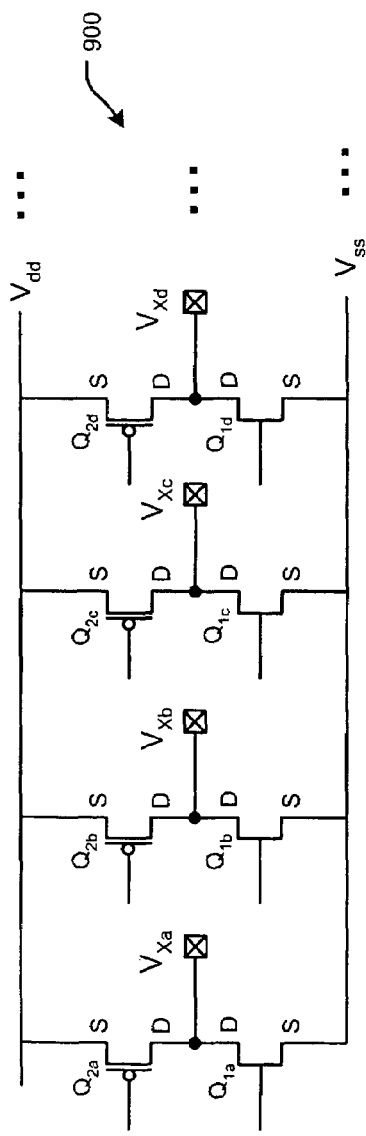
FIG. 32A is an electrical schematic of another exemplary power IC.
Figure 32B:
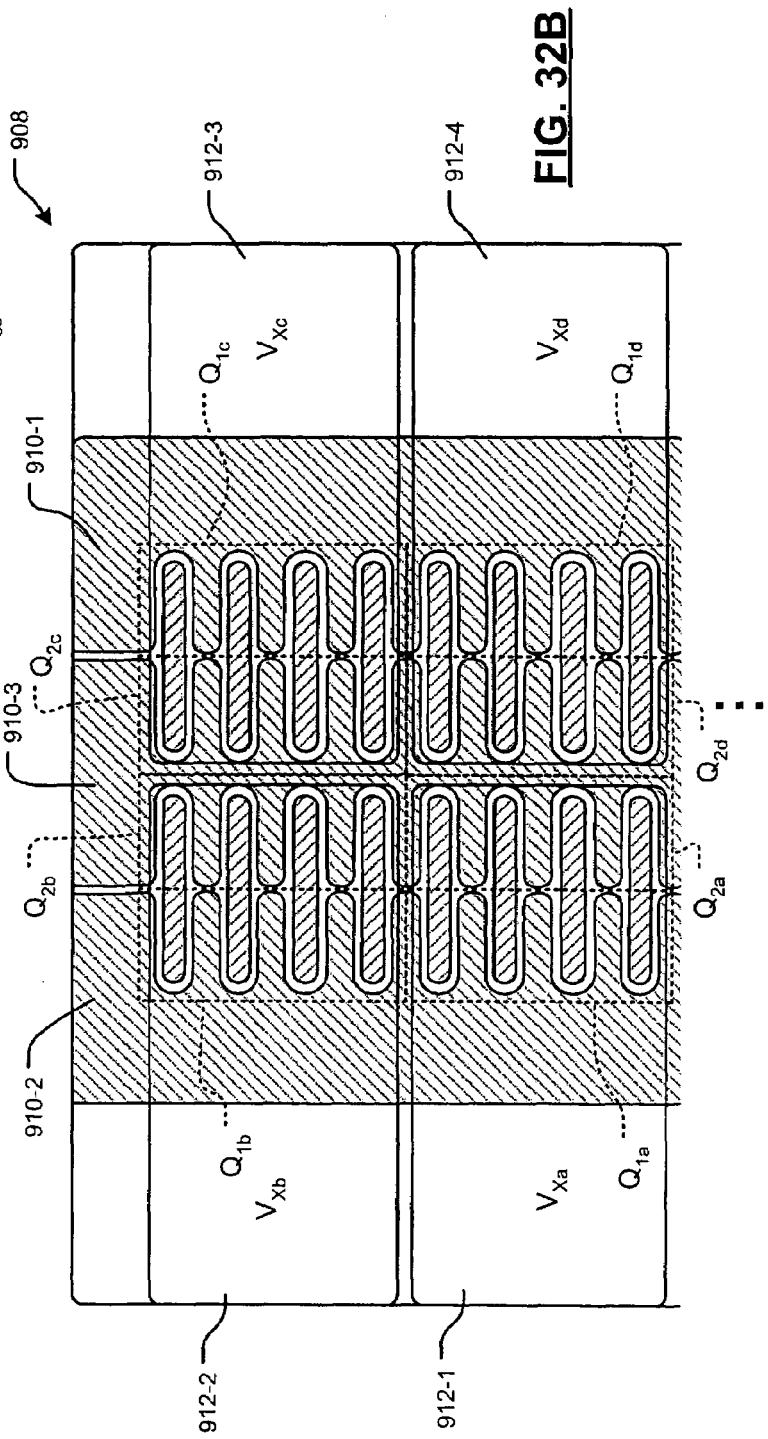
FIG. 32B is a plan view of a substrate with transmission lines that are connected to the power IC of FIG. 32A.

In FIGS. 29-31, the transmission lines or planes were generally located in a single plane. Referring now to FIGS. 32A and 32B, an IC such as a power IC is shown generally at 900. The IC 900 includes transistor pairs $Q_{1a}$, $Q_{2a}$, $Q_{1b}$, $Q_{2b}$, $Q_{1c}$, $Q_{2c}$, and $Q_{1d}$ and $Q_{2d}$ each including a control terminal and first and second terminals. While PMOS and NMOS transistors with gates, sources S and drains D are shown, other types of transistors may be used. Outputs $V_{Xa}$, $V_{Xb}$, $V_{Xc}$ and $V_{Xd}$ are taken between connected terminals of the pairs. The remaining terminals of the transistor pairs are connected to $V_{dd}$ and $V_{ss}$.

Referring now to FIG. 32B, the top metal layer of the IC 900 preferably has a layout that is similar to that shown in FIG. 8B. The transistor pairs are arranged adjacent to one another. An interconnect structure 908 includes transmission lines 910-1, 910-2 and 910-3 that are arranged in a first layer and that deliver $V_{ss}$, $V_{dd}$ and $V_{ss}$, respectively, to the transistor pairs. The interconnect structure 908 further includes transmission lines 912-1, 912-2, 912-3 and 912-4 that are arranged in a second layer and that receive output signals $V_{Xa}$, $V_{Xb}$, $V_{Xc}$ and $V_{Xd}$, respectively, from the transistor pairs.

Referring now to FIG. 33, an interconnect structure 950 includes transmission lines or planes that are arranged in first and second layers. The second layer provides power and/or ground connections to an IC 951. In the implementation in FIG. 33, the second layer includes transmission lines or planes 954-1 and 954-2. The first layer includes a transmission line or plane 954-3. A capacitor 960 is connected between the transmission lines 954-1 and 954-2. By using the second layer for power and/or ground, the capacitor 960 can be connected to the IC 951 with low inductance. The connection structure 950 can be implemented using a PCB or using a built-up substrate using a PCB-like material. In one implementation, the first layer is located between the IC 951 and the second layer. Skilled artisans will appreciate that there are other ways of implementing the connection structure.

Spacing between the transmission lines or planes in FIGS. 29-33 is preferably minimized to reduce parasitic capacitance and increase shielding. For example, spacing that is less than approximately 12 mils is suitable. Preferably, spacing that is less than 8 mils is used. Some of the leadframes that are shown in FIGS. 29-31 may be implemented as quad flat no-lead (QFN) packages.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An integrated circuit, comprising:
   first, second, and third plane-like metal layers;
   a first transistor having a first control terminal, a first terminal that communicates with said second plane-like metal layer and a second terminal that communicates with said first plane-like metal layer;
   a second transistor having a second control terminal, a third terminal that communicates with said first plane-like metal layer and a fourth terminal that communicates with said third plane-like metal layer; and
   a fourth plane-like metal layer that includes first, second and third contact portions that communicate with said second plane-like metal layer, said first plane-like metal layer and said third plane-like metal layer, respectively, wherein the first, second, and third contact portions are located at an exposed upper surface of the fourth plane-like metal layer.

2. The integrated circuit of claim 1 wherein said fourth plane-like metal layer is a top layer that is thicker than said first, second and third plane-like metal layers.

3. The integrated circuit of claim 1 wherein said second and third plane-like metal layers are coplanar.

4. The integrated circuit of claim 1 wherein said second and third plane-like metal layers are located in separate planes.

5. The integrated circuit of claim 1 further comprising a plurality of local interconnects that communicate with said first terminal, said second terminal and said first control terminal of said first transistor and said third terminal, said fourth terminal and said second control terminal of said second transistor.

6. The integrated circuit of claim 1 wherein said first and second transistors are NINOS transistors, said first and second control terminals are gates, said first and third terminals are drains and said second and fourth terminals are sources.

7. The integrated circuit of claim 1 wherein said first plane-like metal layer is arranged between said second and third plane-like metal layers and said first and second transistors.

8. The integrated circuit of claim 1 wherein said second and third plane-like metal layers are arranged between said first plane-like metal layer and said first and second transistors.

9. The integrated circuit of claim 1 further comprising insulating material that is arranged between said first, second, third and fourth plane-like metal layers.

10. The integrated circuit of claim 1 wherein said integrated circuit has a length to width ratio of at least 2:1.

11. The integrated circuit of claim 1 wherein said integrated circuit implements a power IC, said first contact portion supplies a first voltage potential to said power IC, said third contact portion supplies a second voltage potential to said power IC and said second contact portion receives an output voltage of said power IC.

12. The integrated circuit of claim 11 wherein said first contact portion supplies Vss, to said first and second transistors, said second contract portion reteives $V_x$ from said first and second transistors and said third contact portion supplies $V_{dd}$ to said first and second transistors.

13. The integrated circuit of claim 1 further comprising:
   an additional contact portion that is arranged in said fourth plane-like metal layer; and
   local interconnects that connect said additional contact portion with at least one of said first and second control terminals of said transistors.

14. The integrated circuit of claim 1 wherein said first, second and third contact portions of said fourth plane-like metal layer substantially overlap an underlying area defined by said first and second transistors.

15. The integrated circuit of claim 14 wherein said first, second and third contact portions cover approximately ⅓ of said underlying area.

16. The integrated circuit of claim 1 wherein each of said first, second and third plane-like metal layers cover greater than approximately 80% of both of said underlying first and second transistors.

17. The integrated circuit of claim 1 wherein said first plane-like metal layer covers greater than approximately 80% of both of said underlying first and second transistors and wherein said second and third plane-like metal layers cover greater than approximately 80% of said first and second transistors, respectively.

18. The integrated circuit of claim 1 wherein said first, second and third plane-like metal layers allow current to flow in both x and y directions, wherein said x direction is orthogonal to said y direction.

19. An integrated circuit, comprising:
first, second, and third plane-like metal layers;
a first transistor having a first control terminal, a first terminal that communicates with said second plane-like metal layer and a second terminal that communicates with said first plane-like metal layer;
a second transistor having a second control terminal, a third terminal that communicates with said first plane-like metal layer and a fourth terminal that communicates with said third plane-like metal layer; and
a fourth plane-like metal layer that includes first, second and third contact portions that communicate with said second plane-like metal layer, said first plane-like metal layer and said third plane-like metal layer, respectively,
wherein said first transistor is a PIVIOS transistor, said second transistor is an NIVIOS transistor, said first and second control terminals are gates, said first terminal is a source, said second terminal is a drain, said third terminal is a drain, and said fourth terminal is a source.

20. An integrated circuit, comprising:
first, second, and third plane-like metal layers;
a first transistor having a first control terminal, a first terminal that communicates with said second plane-like metal layer and a second terminal that communicates with said first plane-like metal layer;
a second transistor having a second control terminal, a third terminal that communicates with said first plane-like metal layer and a fourth terminal that communicates with said third plane-like metal layer; and
a fourth plane-like metal layer that includes first, second and third contact portions that communicate with said second plane-like metal layer, said first plane-like metal layer and said third plane-like metal layer, respectively,
wherein said first, second, and third contact portions have an elliptical shape.

21. An integrated circuit, comprising:
first, second, and third plane-like metal layers;
a first transistor having a first control terminal, a first terminal that communicates with said second plane-like metal layer and a second terminal that communicates with said first plane-like metal layer;
a second transistor having a second control terminal, a third terminal that communicates with said first plane-like metal layer and a fourth terminal that communicates with said third plane-like metal layer; and
a fourth plane-like metal layer that includes first, second and third contact portions that communicate with said second plane-like metal layer, said first plane-like metal layer and said third plane-like metal layer, respectively,
wherein said first, second and third contact portions are generally rectangular and each substantially cover approximately "⅓" of an underlying area defined by said first and second transistors less an area between said first, second and third contact portions.

22. An integrated circuit, comprising:
first, second, and third plane-like metal layers;
a first transistor having a first control terminal, a first terminal that communicates with said second plane-like metal layer and a second terminal that communicates with said first plane-like metal layer;
a second transistor having a second control terminal, a third terminal that communicates with said first plane-like metal layer and a fourth terminal that communicates with said third plane-like metal layer; and
a fourth plane-like metal layer that includes first, second and third contact portions that communicate with said second plane-like metal layer, said first plane-like metal layer and said third plane-like metal layer, resDectively,
wherein one of $V_{dd}$ and $V_{ss}$ is supplied to said first contact portion, the other of said $V_{dd}$ and $V_{ss}$ is supplied to said third contact portion and $V_x$ is output by said second contact portion, wherein a first pair includes said first and second transistors and further comprising second and third pairs of said first and second transistors arranged on opposite sides of said first pair.

23. The integrated circuit of claim 22 wherein said first contact portion supplies said one of said $V_{ss}$ and $V_{dd}$ to said second transistor of said second pair and said first transistor of said first pair, wherein said third contact portion supplies said other of said $V_{ss}$ and $V_{dd}$ to said second transistor of said first pair and said first transistor of said third pair.

24. An integrated circuit, comprising:
first, second, and third plane-like metal layers;
a first transistor having a first control terminal, a first terminal that communicates with said second plane-like metal layer and a second terminal that communicates with said first plane-like metal layer;
a second transistor having a second control terminal, a third terminal that communicates with said first plane-like metal layer and a fourth terminal that communicates with said third plane-like metal layer; and
a fourth plane-like metal layer that includes first, second and third contact portions that communicate with said second plane-like metal layer, said first plane-like metal layer and said third plane-like metal layer, respectively,
wherein said first and third contact have a base portion and wings that extend from said base portion, and said second contact portions are received between said wings of said portions wherein first and third contact portions.

25. The integrated circuit of claim 24 wherein said first, second and third contact portions each substantially cover approximately ⅓ an underlying area defined by said first and second transistors less an area between said first, second and third contact portions.

26. An integrated circuit, comprising:
first, second, and third plane-like metal layers;
a first transistor having a first control terminal, a first terminal that communicates with said second plane-like metal layer and a second terminal that communicates with said first plane-like metal layer;
a second transistor having a second control terminal, a third terminal that communicates with said first plane-like metal layer and a fourth terminal that communicates with said third plane-like metal layer; and a fourth plane-like metal layer that includes first, second and third contact portions that communicate with said second plane-like metal layer, said first plane-like metal layer and said third plane-like metal layer, respectively, wherein a first pair includes said first and second transistors and further comprising second, third and fourth pairs of transistors that are arranged in a generally square arrangement.

27. The integrated circuit of claim 26 wherein each of said second, third and fourth pairs of transistors include:
   a third transistor having a third control terminal, a fifth terminal that communicates with said second plane-like metal layer and a sixth terminal that communicates with said first plane-like metal layer; and
   a fourth transistor having a fourth control terminal, a seventh terminal that communicates with said first plane-like metal layer and an eighth terminal that communicates with said third plane-like metal layer.

28. The integrated circuit of claim 27 wherein said fourth metal layer further includes fourth, fifth, sixth and seventh contact portions, wherein said first, and fourth contact portions have a base portion and wings that extend from said base portion, wherein said third contact portion has a base portion and wings that extend from opposite sides of said base portion, and wherein said second and sixth contact portions are received between said wings of said first and third contact portions, and said fifth and seventh contact portions are received between wings of said third and fourth contact portions.

29. The integrated circuit of claim 28 wherein said first contact portion supplies one of $V_{ss}$ and $V_{dd}$ to said first and third pairs of transistors, wherein said second contact portion receives $V_x$ from said first pair of transistors, said third contact portion supplies the other of said $V_{ss}$ and $V_{dd}$ to said first, second, third and fourth pairs of transistors, said fourth contact portion supplies said one of said $V_{ss}$ and $V_{dd}$ to said second and fourth pairs of transistors and said fifth, sixth and seventh contact portions receive $V_x$ from said second, third and fourth pairs of transistors, respectively.

30. The integrated circuit of claim 29 further comprising:
   a substrate having first, second, third, fourth, fifth, sixth and seventh transmission lines that are arranged on a first side thereof and that communicate with said first, second, third, fourth, fifth, sixth and seventh contact portions;
   eighth, ninth, tenth and eleventh transmission lines arranged on an opposite side of said substrate; and
   vias in said substrate connecting said second, fifth, sixth and seventh transmission lines to said eighth, ninth, tenth and eleventh transmission lines.

31. An integrated circuit, comprising:
   first, second, and third plane-like metal layers;
   a first transistor having a first control terminal, a first terminal that communicates with said second plane-like metal layer and a second terminal that communicates with said first plane-like metal layer;
   a second transistor having a second control terminal, a third terminal that communicates with said first plane-like metal layer and a fourth terminal that communicates with said third plane-like metal layer; and
   a fourth plane-like metal layer that includes first, second and third contact portions that communicate with said second plane-like metal layer, said first plane-like metal layer and said third plane-like metal layer, respectively, wherein said first and third contact portions are generally "C"-shaped and wherein said second contact portion is arranged between said first and third contact portions.

32. An integrated circuit, comprising:
   first, second, and third plane-like metal layers;
   a first transistor having a first control terminal, a first terminal that communicates with said second plane-like metal layer and a second terminal that communicates with said first plane-like metal layer;
   a second transistor having a second control terminal, a third terminal that communicates with said first plane-like metal layer and a fourth terminal that communicates with said third plane-like metal layer; and
   a fourth plane-like metal layer that includes first, second and third contact portions that communicate with said second plane-like metal layer, said first plane-like metal layer and said third plane-like metal layer, respectively, wherein said second contact portion is generally "H"-shaped and said first and second contact portions are generally rectangular shaped.

33. An integrated circuit, comprising:
   first, second, and third plane-like metal layers;
   a first transistor having a first control terminal, a first terminal that communicates with said second plane-like metal layer and a second terminal that communicates with said first plane-like metal layer;
   a second transistor having a second control terminal, a third terminal that communicates with said first plane-like metal layer and a fourth terminal that communicates with said third plane-like metal layer;
   a fourth plane-like metal layer that includes first, second and third contact portions that communicate with said second plane-like metal layer, said first plane-like metal layer and said third plane-like metal layer, respectively; and
   a leadframe including first, second and third transmission lines that communicate with said first, second and third contact portions, respectively.

34. The system of claim 33 wherein said integrated circuit and said first, second and third transmission lines are encased by a mold compound.

35. The system of claim 33 wherein said leadframe and said integrated circuit implement a quad flat no-lead (QFN) package.

36. An integrated circuit, comprising:
   first, second, and third plane-like metal layers;
   a first transistor having a first control terminal, a first terminal that communicates with said second plane-like metal layer and a second terminal that communicates with said first plane-like metal layer;
   a second transistor having a second control terminal, a third terminal that communicates with said first plane-like metal layer and a fourth terminal that communicates with said third plane-like metal layer;
   a fourth plane-like metal layer that includes first, second and third contact portions that communicate with said second plane-like metal layer, said first plane-like metal layer and said third plane-like metal layer, respectively;
   a first transmission line that communicates with said first contact portion;
   a second transmission line that communicates with said second contact portion; and
   a third transmission line that communicates with said third contact portion.

37. The system of claim 36 wherein said first transmission line is connected to $V_{ss}$, said second transmission line is connected to $V_x$ and said third transmission line is connected to $V_{dd}$, and wherein said first, second and third transmission lines extend from one side of said integrated circuit.

38. The system of claim 36 wherein said first transmission line is connected to Vss, said second transmission line is connected to $V_x$ and said third transmission line is connected to $V_{dd}$, wherein said first and third transmission lines extend from one side of said integrated circuit, and wherein said second transmission line extends from an opposite side of said integrated circuit.

39. The system of claim 38 further comprising a capacitance that has one end that communicates with said second transmission line and an opposite end that communicates with said third transmission line, wherein said second transmission line supplies a first voltage potential and said third transmission line supplies a second voltage potential.

40. The sysfem of claim 36 wherein said first transmission line is located in a first layer and wherein said second and third transmission lines are located in a second layer.

41. The system of claim 36 wherein said first, second and third transmission lines are arranged on a substrate.

42. An integrated circuit, comnrising:
   first, second, and third plane-like metal layers;
   a first transistor having a first control terminal, a first terminal that communicates with said second plane-like metal layer and a second terminal that communicates with said first plane-like metal layer;
   a second transistor having a second control terminal, a third terminal that communicates with said first plane-like metal layer and a fourth terminal that communicates with said third plane-like metal layer;
   a fourth plane-like metal layer that includes first, second and third contact portions that communicate with said second plane-like metal layer, said first plane-like metal layer and said third plane-like metal layer, respectively,
   a third transistor having a third control terminal, a fifth terminal that communicates with said second plane-like metal layer and a sixth terminal that communicates with said first plane-like metal layer; and
   a fourth transistor having a fourth control terminal, a seventh terminal that communicates with said first plane-like metal layer and an eighth terminal that communicates with said third plane-like metal layer,
   wherein said fourth plane-like metal layer includes fourth and fifth contact portions that communicate with said first plane-like metal layer and said second plane-like metal layer, respectively.

43. The integrated circuit of claim 42 wherein said first contact portion provides one of $V_{ss}$ and $V_{dd}$ to said first and second transistors, said second contact portion receives $V_x$ from said first and second transistors, said third contact portion provides the other of said $V_{ss}$ and $V_{dd}$ to said first, second, third and fourth transistors, said fourth contact portion receives $V_x$ from said third and fourth transistors, and said fifth contact portion provides said one of said $V_{ss}$ and $V_{dd}$ to said third and fourth transistors.

44. The integrated circuit of claim 42 further comprising:
   a first transmission line that communicates with said first contact portion;
   a second transmission line that communicates with said second contact portion;
   a third transmission line that communicates with said third contact portion;
   a fourth transmission line that communicates with said fourth contact portion; and
   a fifth transmission line that communicates with said fifth contact portion.

45. The integrated circuit of claim 44 wherein said first, third and fifth transmission lines are arranged on one side of said integrated circuit and said second and fourth transmission lines are arranged on an opposite side of said integrated circuit.

46. The integrated circuit of claim 45 wherein a first pitch defined by said first, third and fifth transmission lines is twice a second pitch defined by said first, second, third and fourth transistors.

47. The integrated circuit of claim 44 further comprising:
   additional pairs of transistors arranged adjacent to said first, second, third and fourth transistors for a total of n transistors;
   additional contact portions in said fourth metal layer for a total of m contact portions, wherein m=n+1; and
   additional transmission lines that are connected to said additional contact portions for a total of m transmission lines.

* * * * *

UNITED STATES PATENT AND TRADEMARK OFFICE
CERTIFICATE OF CORRECTION

PATENT NO. : 7,265,448 B2
APPLICATION NO. : 10/765474
DATED : September 4, 2007
INVENTOR(S) : Sehat Sutardja It is certified that error appears in the above-identified patent and that said Letters Patent is hereby corrected as shown below:

| | |
|---|---|
| Column 4, Line 13 | Delete "." after "of" |
| Column 8, Line 24 | Delete "an" and insert -- a -- |
| Column 10, Line 60 | Delete "maybe" and insert -- may be -- |
| Column 11, Line 30 | Delete "are" after "layers" |
| Column 14, Line 33-34 | Delete "$Q_{1\ and\ Q2}$" and insert -- $Q_1$ and $Q_2$ -- |
| Column 14, Line 34 | Delete "$Q_{1\ and\ Q2}$" and insert -- $Q_1$ and $Q_2$ -- |
| Column 14, Line 56 | Delete "$Q_{1\ and\ Q2}$" and insert -- $Q_1$ and $Q_2$ -- |
| Column 16, Line 54 | Delete "Vss" and insert -- $V_{ss}$ -- |
| Column 16, Line 55 | Delete "retieves" and insert -- receives -- |
| Column 16, Line 29 | Delete "NINOS" and insert -- NMOS -- |
| Column 17, Line 32 | Delete "PIVIOS" and insert -- PMOS -- |
| Column 17, Line 33 | Delete "NIVIOS" and insert -- NMOS -- |
| Column 18, Line 19-20 | Delete "resDectively" and insert -- respectively -- |
| Column 18, Line 48 | Insert -- portions -- after "contact" |
| Column 18, Line 51 | Delete "portions wherein" after "said" |
| Column 21, Line 2 | Delete "Vss" and insert -- $V_{ss}$ -- |
| Column 21, Line 14 | Delete "sysfem" and insert -- system -- |
| Column 21, Line 19 | Delete "comnrising" and insert -- comprising -- |

Signed and Sealed this

Twenty-seventh Day of May, 2008

JON W. DUDAS
*Director of the United States Patent and Trademark Office*